(12) United States Patent
Lin et al.

(10) Patent No.: US 11,688,652 B2
(45) Date of Patent: Jun. 27, 2023

(54) WAFER LEVEL TESTING OF OPTICAL COMPONENTS

(71) Applicant: II-VI Delaware, Inc., Wilmington, DE (US)

(72) Inventors: Shiyun Lin, San Diego, CA (US); Daniel Mahgerefteh, Los Angeles, CA (US); Bryan Park, Sunnyvale, CA (US); Jin-Hyoung Lee, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 17/653,524

(22) Filed: Mar. 4, 2022

(65) Prior Publication Data
US 2022/0189831 A1 Jun. 16, 2022

Related U.S. Application Data

(62) Division of application No. 16/517,404, filed on Jul. 19, 2019, now Pat. No. 11,295,994.

(60) Provisional application No. 62/701,377, filed on Jul. 20, 2018.

(51) Int. Cl.
| | | |
|---|---|---|
| *G01R 31/26* | (2020.01) | |
| *H01L 21/66* | (2006.01) | |
| *G02B 6/42* | (2006.01) | |
| *G01R 31/28* | (2006.01) | |
| *G02B 6/13* | (2006.01) | |
| *G01R 31/311* | (2006.01) | |
| *G02B 1/11* | (2015.01) | |

(52) U.S. Cl.
CPC ......... *H01L 22/14* (2013.01); *G01R 31/2896* (2013.01); *G01R 31/311* (2013.01); *G02B 1/11* (2013.01); *G02B 6/13* (2013.01); *G02B 6/4214* (2013.01); *H01L 22/30* (2013.01)

(58) Field of Classification Search
CPC .................................................... G01R 31/26
See application file for complete search history.

(56) References Cited

U.S. PATENT DOCUMENTS

| | | |
|---|---|---|
| 2016/0131837 A1 | 5/2016 | Mahgerefteh et al. |
| 2017/0179680 A1 | 6/2017 | Mahgerefteh et al. |

*Primary Examiner* — Mohammad M Choudhry
(74) *Attorney, Agent, or Firm* — Blank Rome LLP

(57) ABSTRACT

A system may include a wafer that includes ICs and defines cavities. Each cavity may be formed in a BEOL layer of the wafer and proximate a different IC. The system may also include an interposer that includes a transparent layer configured to permit optical signals to pass through. The interposer may also include at least one waveguide located proximate the transparent layer. The at least one waveguide may be configured to adiabatically couple at least one optical signal out of the multiple ICs. Further, the interposer may include a redirecting element optically coupled to the at least one the waveguide. The redirecting element may be located proximate the transparent layer and may be configured to receive the at least one optical signal from the at least one waveguide. The redirecting element may also be configured to vertically redirect the at least one optical signal towards the transparent layer.

20 Claims, 10 Drawing Sheets

WAFER LEVEL TESTING OF OPTICAL COMPONENTS

CROSS-REFERENCE TO RELATED APPLICATION

This application is a divisional of U.S. patent application Ser. No. 16/517,404 filed Jul. 19, 2019, which claims the benefit of and priority to U.S. Provisional Patent Application No. 62/701,377 filed Jul. 20, 2018, both of which are incorporated herein by reference.

FIELD

The embodiments discussed in the present disclosure are related to wafer testing of optical components.

BACKGROUND

Unless otherwise indicated herein, the materials described herein are not prior art to the claims in the present application and are not admitted to be prior art by inclusion in this section.

Wafer level testing and validation of adiabatic couplers and other optical components may be used to verify the wafer process of the adiabatic couplers, a photonic integrated circuit (PIC), and/or an optical integrated circuit (OIC). There are two conventional solutions to couple light into or out of an adiabatic coupler located in a wafer. One conventional solution to couple light into or out of adiabatic couplers located in a wafer may include surface grating couplers. Another conventional solution to couple light into or out of an adiabatic coupler located in a wafer may include edge couplers for coupling light into or out of an edge of the adiabatic couplers.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In at least one embodiment, a system may include a wafer. The wafer may include multiple integrated circuits (ICs). The wafer may also define multiple cavities. Each of the cavities may be formed in a back end of line (BEOL) layer of the wafer. A BEOL layer may include one or more layers formed on and subsequent to one or more other layers. In addition, each of the cavities may be formed proximate a different IC of the multiple ICs. The system may also include an interposer. The interposer may include a transparent layer. The transparent layer may be configured to permit optical signals to pass through. The interposer may also include at least one waveguide. The at least one waveguide may be located proximate the transparent layer. The at least one waveguide may be configured to adiabatically couple at least one optical signal out of the multiple ICs. In addition, the interposer may include a redirecting element. The redirecting element may be optically coupled to the at least one the waveguide. In addition, the redirecting element may be located proximate the transparent layer. The redirecting element may be configured to receive the at least one optical signal from the at least one waveguide. The redirecting element may also be configured to vertically redirect the at least one optical signal towards the transparent layer.

In at least one embodiment, a method may include forming a wafer. The wafer may include multiple ICs. Each IC may include one or more adiabatic coupler. The method may also include forming multiple cavities in a BEOL layer of the wafer. A BEOL layer may include one or more layers formed on and subsequent to one or more other layers. Each cavity may be formed proximate a different IC. In addition, the method may include positioning an interposer within a cavity. The interposer may be positioned proximate a corresponding IC. Further, the method may include adiabatically coupling an optical signal out of the corresponding IC. The optical signal may be adiabatically coupled into a waveguide of the interposer.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only example embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1A:
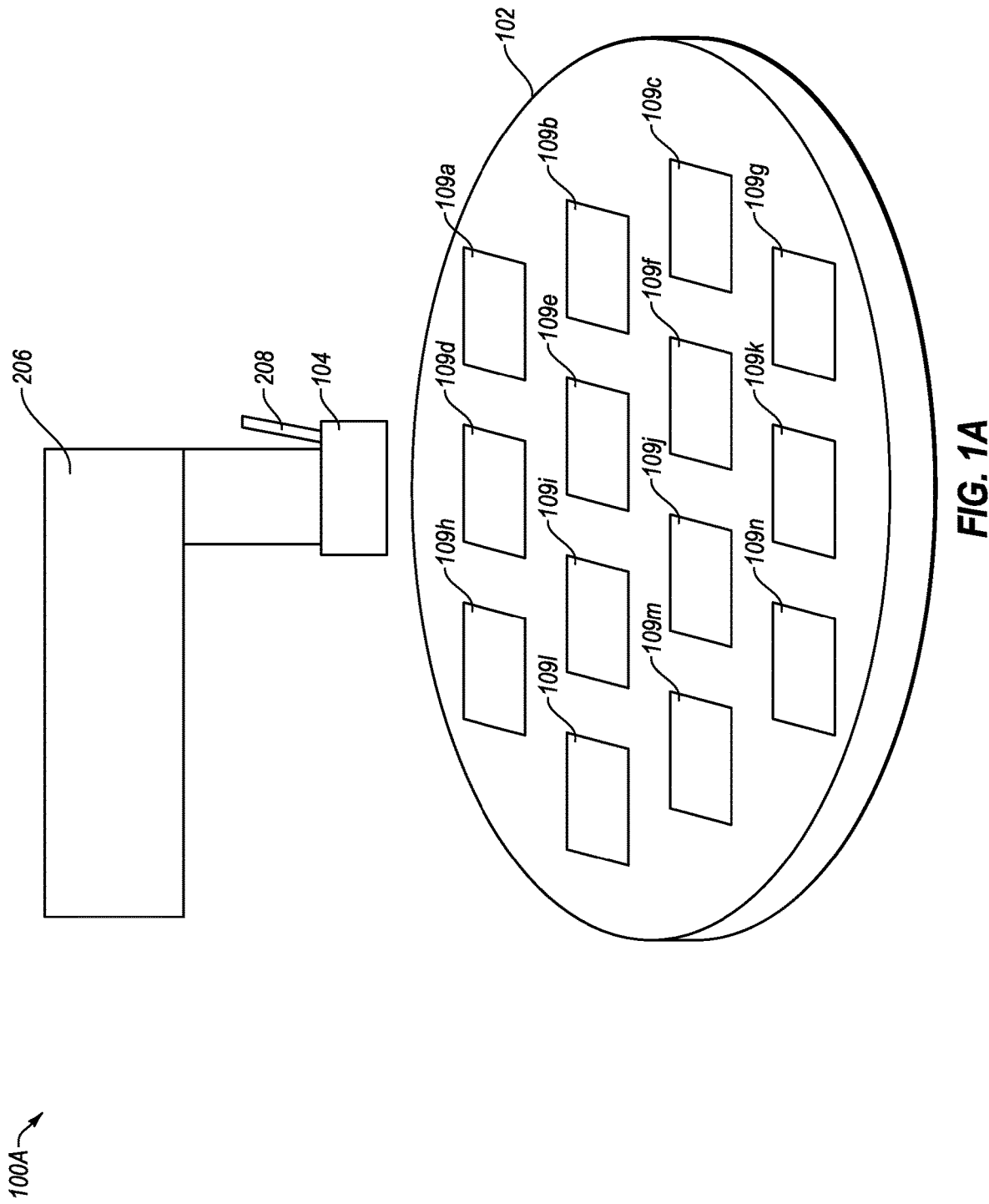
FIG. 1A illustrates a perspective view of a photonic system including an interposer for wafer level testing of optical components located in a wafer.

In some optical systems, grating couplers may be used to test and validate adiabatic couplers located in a wafer. The use of grating couplers to test and validate the adiabatic couplers at wafer level may be highly wavelength dependent and may include a relatively small pass band. In other optical systems, edge couplers may be used since adiabatic couplers may include an edge-coupled nature. In these and other optical systems, dicing of the wafers may be performed prior to testing and validating the adiabatic couplers to expose an edge of the adiabatic couplers. The wafers may be diced such that the adiabatic couplers may include a cleaved facet. Dicing the wafer to test the adiabatic couplers may incur additional time and cost producing and/or testing adiabatic couplers that may not operate properly due to improper wafer processing.

In some embodiments, the adiabatic couplers may be tested and/or verified prior to dicing the wafers by vertically coupling optical signals into and out of the adiabatic couplers and/or other optical components located in a wafer. Vertically coupling the optical signals into and out of the adiabatic couplers and/or other optical components may permit wafer level testing of the adiabatic couplers and/or other optical components located in the wafer prior to dicing the wafer. For example, the optical signals may be adiabatically coupled from one or more adiabatic couplers located in a silicon (Si) wafer to one or more interposer waveguides (e.g., polymer or high index glass waveguides or the like) located in an interposer. The optical signals may propagate from the interposer waveguides to one or more grating couplers (e.g., polymer or high index glass grating couplers or the like) optically coupled to the interposer waveguides. Additionally, the optical signals may be redirected vertically by the grating couplers to one or more (e.g., photo-detectors, photodiodes, optical fibers, or the like). Additionally or alternatively, optical signals may be processed in the reverse direction. For example, the optical signals may be received by the grating couplers from one or more optical fibers or other optical sources. The optical signals received by the grating couplers may be redirected horizontally by the grating couplers and received by the interposer waveguides In addition, the optical signals received by the interposer waveguides may be adiabatically coupled into the adiabatic couplers located in the Si wafer.

In some embodiments, the optical signals may be adiabatically coupled out of the adiabatic couplers located in the wafer into the interposer waveguides (e.g., polymer or high index glass waveguide or the like) located in the interposer. The optical signals may propagate from the interposer waveguides to a mirror. The mirror may vertically redirect the optical signals to the photo receivers (e.g., photo-detectors, photodiodes, optical fibers, or the like). Additionally or alternatively, optical signals may be processed in the reverse direction. For example, the optical signals may be received from one or more optical fibers or other optical sources and may be redirected horizontally by the mirror to and received by the interposer waveguides. The optical signals received by the interposer waveguides may be adiabatically coupled into the adiabatic couplers located in the wafer.

In some embodiments, the optical signals may be adiabatically coupled out of the adiabatic couplers located in the wafer into a first waveguide (e.g., a Si waveguide, a Silicon Nitride (SiN) waveguide, or the like) located in the interposer. Additionally, the optical signals may be adiabatically coupled out of the first waveguide into a second waveguide (e.g., a Si waveguide, a SiN waveguide, or the like). The optical signals may propagate from the second waveguide to one or more grating couplers (e.g., Si grating couplers, SiN grating couplers, or the like) optically coupled to the second waveguide. Furthermore, the grating couplers may vertically redirect the optical signals to the one or more photo receivers (e.g., photo-detectors, photodiodes, optical fibers, or the like). Additionally or alternatively, the optical signals may be received by the grating couplers from the optical fibers and may be redirected horizontally by the grating couplers and received by the second waveguide. In addition, the optical signals received by the second waveguide may be adiabatically coupled into the first waveguide and then adiabatically coupled into the adiabatic couplers located in the wafer.

In some embodiments, the optical signals adiabatically coupled out of the interposer waveguides may be used to test optical components located in the wafer. For example, the adiabatic couplers may be optically coupled to a photonic integrated circuit (PIC). The optical signals may traverse the PIC and be received by the photo receivers via a different adiabatic coupler. The optical signals received by the different adiabatic couplers may be tested for signal strength or any other appropriate optical attribute for verifying the PIC and/or other optical components located in the wafer. As another example, the adiabatic couplers may be verified to determine whether the adiabatic couplers were damaged or improperly formed during or after the production of the wafer. Verification of the adiabatic couplers may indicate whether other optical components located in the wafer were also properly formed during production.

In some embodiments, the layer of the wafer that includes the adiabatic couplers (e.g., a front end of line (FEOL) layer or the like) may be positioned below a back end of line (BEOL) layer of the wafer. A FEOL layer may include one or more layers formed prior to one or more other layers, such as prior to one or more BEOL layers. Given this structure, a cavity (e.g., a window or the like) may be etched in and/or through the BEOL layer. The cavity may optically expose the adiabatic couplers for coupling the one or more adiabatic couplers located in the wafer with the interposer waveguides located in the interposer. In some embodiments, the interposer waveguides may include polymer or high index glass waveguides with a refractive index near 1.5.

For at least these reasons, the wafer level testing or verification of adiabatic couplers and/or other optical components may be performed at the wafer level without dicing the wafer and/or performing copper pillar bumping.

For ease of reference in the discussion that follows, adiabatically coupling, propagating, and or otherwise manipulating optical signals is often discussed in the context of a single optical path with the understanding that multiple such optical paths may be included in a given system in parallel and/or in line with each other.

As used in the present disclosure, the terms "adiabatic coupling" or "adiabatically couple" may include the process of an optical signal being brought out of or into a waveguide and/or an adiabatic coupler due to an effective index of the adiabatic coupler becoming greater than or less than an effective index of the waveguide.

Accordingly, in some embodiments, an adiabatic coupler may be tapered, which may increase or decrease, depending on which direction the optical signal is being propagated, the effective index of the adiabatic coupler in the direction of light propagation. The effective index of the adiabatic coupler may be smaller at the smaller portion of the taper than at the larger portion of the taper and the waveguide may overlap at least a portion of the taper of the adiabatic coupler. When an optical signal reaches a portion of an adiabatic coupler or a waveguide that includes an effective index that is lower than the effective index of the other component, the optical signal may be brought out of the component with the lower effective index and into the component with the higher effective index.

FIG. 1A illustrates a perspective view of a photonic system 100A (referenced in the present disclosure as 'system 100A') including an interposer 104 for wafer level testing of optical components located in a wafer 102, in accordance with at least one embodiment described in the present disclosure. The system 100A may include the wafer 102, the interposer 104, an optical component 208, and a testing fixture 206.

The system 100A may be configured to transmit and/or receive optical signals via coarse wavelength division multiplexing (CWDM) with four lanes (CWDM4), CWDM with two lanes, parallel single mode four channel (PSM4), DR4, FR4, LR4, LRB, or any other acceptable optical signal standard. The wafer 102 may include silicon material, silicon-on-insulator, silicon nitride material, or any other suitable material for a wafer.

The term "optical signal" is used generically in the present disclosure to refer to electromagnetic radiation of any suitable wavelength and with data encoded thereon, and may include optical signals with wavelengths of, e.g., about 1260-1360 nm, 1360-1460 nm, 1530-1565 nm, or other suitable wavelengths. Optical signals may also include traverse electric (TE) and/or traverse magnetic (TM) polarization. More generally, embodiments described herein may transmit and/or receive light with or without data encoded on the light, such as optical signals, continuous wave (CW) light, or other suitable light.

In some embodiments, the wafer 102 may define multiple cavities 109a, 109b, 109c, 109d, 109e, 109f, 109g, 109h, 109i, 109j, 109k, 109l, 109m, 109n (hereinafter cavities 109a-n, or generically cavity 109). The cavities 109a-n may be formed in a BEOL layer of the wafer 102. A shape and a size of the cavities 109a-n may be determined based on a shape and a size of the interposer 104. In some embodiments, the cavities 109a-n may be formed proximate one or more adiabatic couplers located in the wafer 102 so as to optically expose the one or more adiabatic couplers. In these and other embodiments, the cavities 109a-n may be formed proximate integrated circuits (ICs) in the wafer 102.

In some embodiments, the optical component 208 may be located on and/or proximate the interposer 104. The interposer 104 and the optical component 208 may be attached to the testing fixture 206. In some embodiments, the interposer 104 may be configured to be at least temporarily placed in one cavity 109 of the cavities 109a-n at a time. Additionally or alternatively, the interposer 104 may be configured to at least temporarily attach (e.g., bond) to the wafer 102 in each of the cavities 109a-n. The interposer 104 may include one or more waveguides, which may adiabatically couple light into or out of the one or more adiabatic couplers located in the wafer 102. Additionally or alternatively, optical signals may be provided to the optical component 208 via the testing fixture 206. Various embodiments of the interposer 104 are discussed below in relation to FIGS. 2-8.

In some embodiments, the testing fixture 206 may be attached to a motorized testing setup. The testing fixture 206 may move, align, and/or remove the interposer 104 during wafer level testing of optical components located in the wafer 102. For example, the testing fixture 206 may move the interposer 104 such that the interposer 104 is aligned with and at least partially located within one of the cavities 109a-n. In addition, in some embodiments, the testing fixture 206 may provide an optical signal to the interposer 104 and/or the optical component 208. The optical signal may propagate through the interposer 104 and be adiabatically coupled into the one or more adiabatic couplers located in the wafer 102.

In some embodiments, the interposer 104 may be configured to adiabatically couple one or more optical signals out of the adiabatic couplers located in the wafer 102 into the interposer 104 (referenced in the present disclosure as 'received optical signals'). For example, the waveguides located in the interposer 104 may adiabatically couple the received optical signals out of the adiabatic couplers located in the wafer 102. The interposer 104 may propagate and provide the received optical signals to the optical component 208. Additionally, the optical component 208 may propagate and provide the received optical signals to an external device.

In some embodiments, verification of the wafer process for producing the wafer 102 may be performed using the system 100A. For example, the interposer 104 may adiabatically couple the received optical signals out of the adiabatic couplers located in the wafer 102 and a signal strength of the received optical signals may be measured to determine whether optical loss is occurring within the adiabatic couplers and/or other optical components located in the wafer 102. Additionally or alternatively, the signal strength of the received optical signals may be measured to determine whether the optical signals are being degraded too much by the adiabatic couplers and/or other optical components and/or to determine an amount of optical loss through the adiabatic couplers and/or other optical components.

In some embodiments, the interposer 104 may be configured to adiabatically couple one or more optical signals into the adiabatic couplers located in the wafer 102 (referenced in the present disclosure as 'transmitted optical signals'). For example, the optical component 208 may provide the transmitted optical signals, which may be adiabatically coupled into the adiabatic couplers located in the wafer 102 via the waveguides in the interposer 104. In some embodiments, the transmitted optical signals may be received by an optical integrated circuit (OIC) and/or a PIC optically coupled to the adiabatic couplers. The transmitted optical signals may propagate through the OIC and/or the PIC and may be adiabatically coupled into a different waveguide in the interposer 104 as the received optical signals. The signal strength and/or the signal quality of the received optical signals may be measured to determine whether the OIC, PIC, and/or the adiabatic couplers are functioning properly.

In some embodiments, an optical loss, an optical spectrum, a differential delay, and/or an eye diagram of the received optical signals may be measured and/or collected to determine an amount of degradation that is occurring in the adiabatic couplers and/or other optical components located in the wafer 102.

Figure 1B:
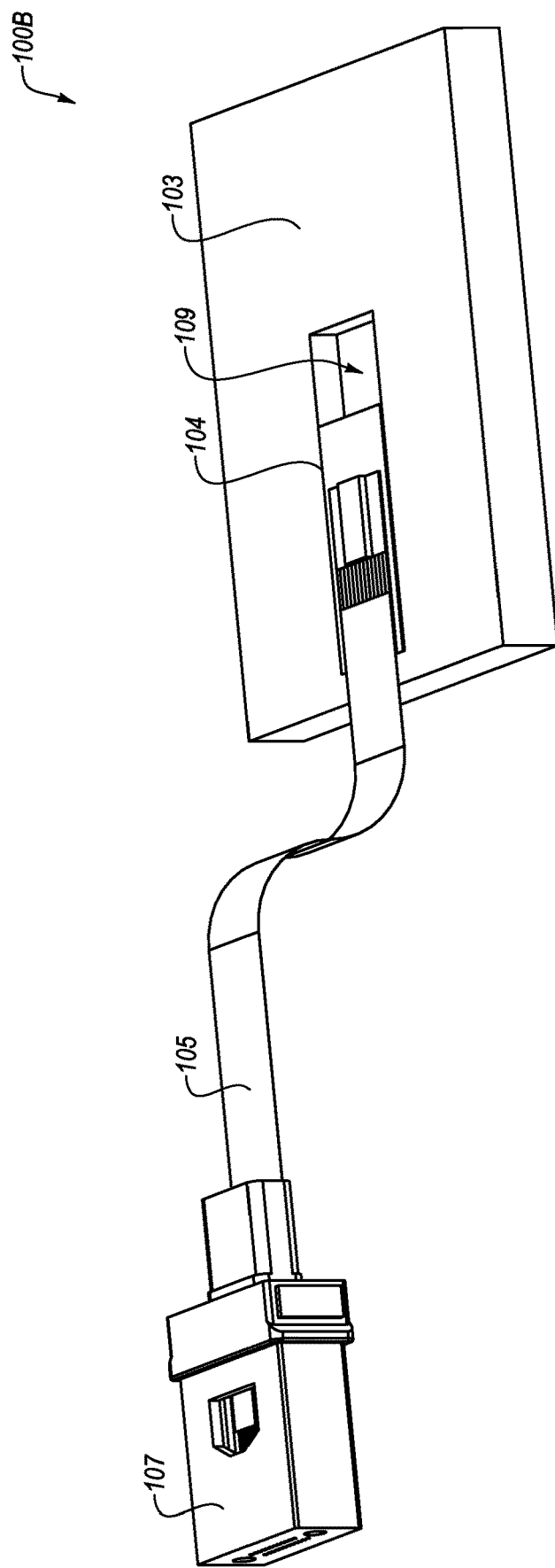
FIG. 1B illustrates a perspective view of a photonic system including a permanent interposer diced from a wafer after wafer level testing.

FIG. 1B illustrates a perspective view of a photonic system 100B (referenced in the present disclosure as 'system 100B') including a permanent interposer 104 diced from a wafer after wafer level testing to form a die 103 in accordance with at least one embodiment described in the present disclosure. The system 100B may be configured to transmit and/or receive optical signals the same as or similar to the system 100A discussed above in relation to FIG. 1A.

The system 100B may include the die 103, the interposer 104, one or more optical fibers 105, and a connector 107. In some embodiments, the die 103 may include a single optical module. Additionally, in some embodiments, the interposer 104 may be permanently attached (e.g., bonded) to the die 103 and may allow the optical module to operate and/or communicate with other devices via the optical fibers 105 and the connector 107. In some embodiments, the system 100B may include a photonic system including the interposer 104 attached on a photonic chip (e.g., the die 103), which is singulated from the wafer after wafer level testing. The wafer from which the die 103 is singulated may be the same as or similar to the wafer 102 discussed above in relation to FIG. 1A.

In some embodiments, the die 103 may define a cavity 109. The cavity 109 may be formed in a BEOL layer of the die 103. A shape and a size of the cavity 109 may be determined based on a shape and a size of the interposer 104. The cavity 109 may be formed proximate one or more adiabatic couplers located in the die 103 so as to optically expose the one or more adiabatic couplers.

In some embodiments, the interposer 104 may be configured to be placed in the cavity 109. The interposer 104 may include one or more waveguides, which may adiabatically couple light into or out of the one or more adiabatic couplers located in the die 103. Additionally, the interposer 104 may provide or receive optical signals via the optical fibers 105. The connector 107 may optically couple the optical fibers 105 to an external device.

In some embodiments, the interposer 104 may be configured to adiabatically couple one or more optical signals that travel from the adiabatic couplers located in the die 103 into the interposer 104 (referenced in the present disclosure as 'received optical signals'). For example, the waveguides located in the interposer 104 may adiabatically couple the received optical signals out of the adiabatic couplers located in the die 103. The interposer 104 may propagate and provide the received optical signals to the optical fibers 105. Additionally, the optical fibers 105 may propagate and provide the received optical signals to the external device.

In some embodiments, the external device may provide one or more optical signals that travel from the external device to the adiabatic couplers located in the die 103 via the optical fibers 105 and the interposer 104 (referenced in the present disclosure as 'transmitted optical signals'). The optical fibers 105 may propagate and provide the transmitted optical signals to the interposer 104. The interposer 104 may propagate and adiabatically couple the transmitted optical signals into the adiabatic couplers located in the die 103 via one or more waveguides in the interposer 104.

Figure 2:
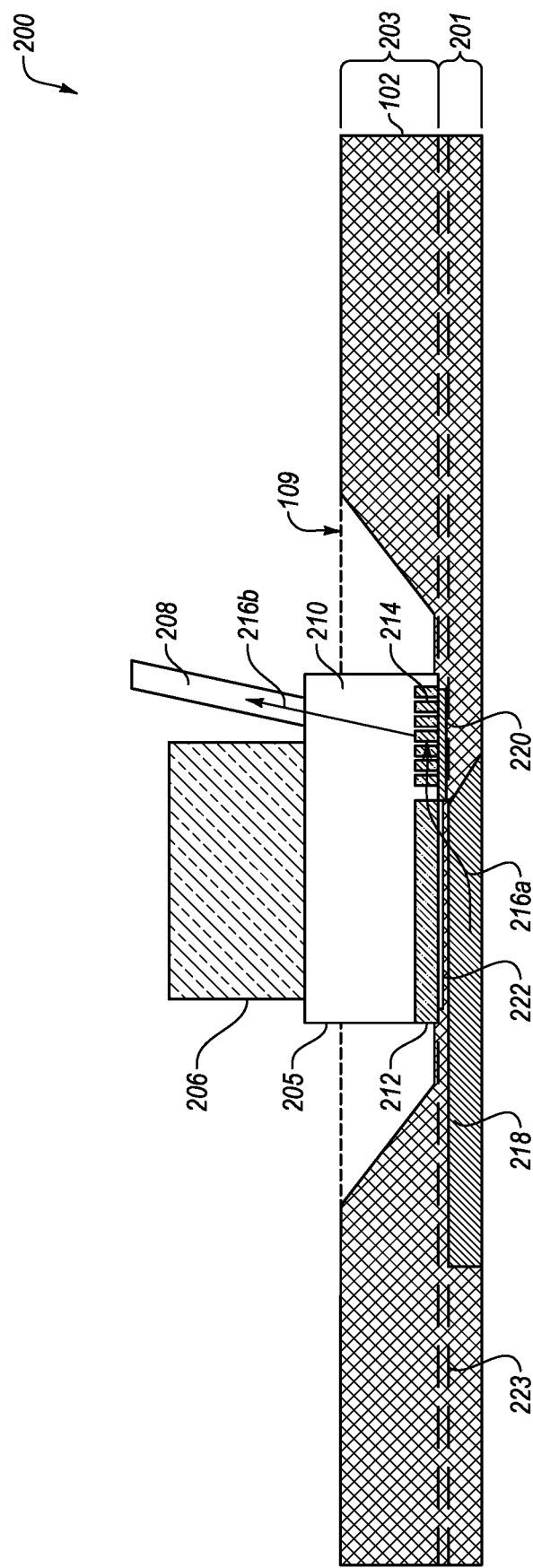
FIG. 2 illustrates a cross-sectional view of a photonic system including an interposer for wafer level testing of optical components located in the wafer of FIG. 1A.

FIG. 2 illustrates a cross-sectional view of a photonic system 200 (referenced in the present disclosure as 'system 200') including an interposer 205 for wafer level testing of optical components located in the wafer 102 of FIG. 1A, in accordance with at least one embodiment described in the present disclosure. The system 200 may include the wafer 102, the interposer 205, the optical component 208, and the testing fixture 206 of FIG. 1A. The interposer 205 may be the same as or similar to the interposer 104 discussed above in relation to FIG. 1A.

In some embodiments, the wafer 102 may define the cavity 109. The cavity 109 may be formed in a BEOL layer 203 of the wafer 102 after the wafer 102 is fabricated. The cavity 109 may optically expose an adiabatic coupler 218 located in a FEOL layer 201 of the wafer 102. The adiabatic coupler 218 may include a waveguide with a tapered end that cooperates with a waveguide in the interposer 205 to adiabatically couple light from the interposer 205 to the wafer 102 or vice versa. The cavity 109 may be formed such that a portion of the FEOL layer 223 is located above the adiabatic coupler 218. The portion of the FEOL layer 223 may be thin enough to enable optical coupling between the adiabatic coupler 218 in the wafer 102 and a waveguide 212 in the interposer 205. Additionally or alternatively, the portion of the FEOL layer 223 may prevent or reduce damage to the adiabatic coupler 218 during wafer level testing of optical components located in the wafer 102. The interposer 205 may be configured to be placed within the cavity 109.

In some embodiments, the interposer 205 may include a transparent layer 210, the waveguide 212, and a grating coupler 214 (e.g., a redirecting element). The grating coupler 214 may be optically coupled to the waveguide 212. The transparent layer 210 may be configured to propagate optical signals so as to permit optical signals to traverse the transparent layer 210. The grating coupler 214 and/or the waveguide 212 may be located proximate the transparent layer 210. Additionally, the interposer 205 may be configured to be placed within the cavity 109 so that the waveguide 212 is located proximate and optically coupled to the adiabatic coupler 218. Furthermore, the interposer 205 may be temporarily attached (e.g., bonded) to the wafer 102 during wafer level testing of the optical components located in the wafer 102. For example, the wafer 102 may include multiple optical modules (e.g., chips) and the interposer 205 may be moved between the various optical modules to test each optical module at the wafer level. In some embodiments, the wafer 102 may include 1,000 chips. In other embodiments, the wafer 102 may include more or fewer than 1,000 chips.

In some embodiments, the optical component 208 may be located proximate the transparent layer 210. For example, the optical component 208 may be located proximate the transparent layer 210 such that the optical component 208 is located vertically above the grating coupler 214. The interposer 205 and the optical component 208 may be attached to the testing fixture 206. The testing fixture 206 may be attached to a motorized testing setup. The testing fixture 206 may move, align, and/or remove the interposer 205 during wafer level testing of the optical components located in the wafer 102.

As illustrated in FIG. 2, the waveguide 212 may adiabatically couple an optical signal 216a (e.g., a received optical signal) out of the adiabatic coupler 218. In some embodiments, the adiabatic coupler 218 may receive the optical signal 216a from an OIC, a PIC, a different adiabatic coupler, or any other appropriate optical component located in the wafer 102. The waveguide 212 may provide the optical signal 216a to the grating coupler 214. The grating coupler 214 may redirect the optical signal 216b (e.g., redirected optical signal) vertically towards the optical component 208. The optical signal 216b may traverse the transparent layer 210 prior to reaching the optical component 208.

The optical component 208 may receive the optical signal 216b and may provide the optical signal 216b to an external device. Additionally or alternatively, the optical component 208 may provide an electrical signal to the external device representative of the optical signal 216b as received by the optical component 208 For example, the optical component 208 may also include a converter configured to convert optical signals to electrical signals. In some embodiments, the converter may provide the electrical signal to the external device. The optical signal 216b and/or the electrical signal provided to the external device may be used to determine whether the adiabatic coupler 218 and/or any of the other optical components in the wafer 102 that propagated the optical signal 216a-b are operating properly.

Additionally or alternatively, the system 200 may operate in the reverse direction. The testing fixture 206 or other component may provide an optical signal (e.g., a transmitted optical signal) to the optical component 208, which in turn provides the optical signal to the transparent layer 210. The optical signal may traverse the transparent layer 210 and may be received by the grating coupler 214. The grating coupler 214 may redirect the optical signal horizontally and provide the optical signal to the waveguide 212. The optical signal may be adiabatically coupled into the adiabatic coupler 218 from the waveguide 212.

In some embodiments, the transparent layer 210 may include a glass material or any other material appropriate for propagating the optical signal 216. Additionally or alternatively, the waveguide 212 may include a glass material, a polymer material, or any other material appropriate for adiabatically coupling the optical signal 216a into or out of the adiabatic coupler 218 and/or providing the optical signal 216a to the grating coupler 214. Furthermore, the grating coupler 214 may include a SiN material, a Si material, a silicon dioxide (SiO2) material, or any other appropriate material for redirecting the optical signal 216b. The adiabatic coupler 218 may include a Si material, a SiN material, or any other suitable material.

In some embodiments, a space 222 may be defined by the interposer 205 and the wafer 102 when the interposer 205 is located in the cavity 109. The space 222 may be located in the cavity 109 between the interposer 205 and the wafer 102. In these and other embodiments, the space 222 may include a removable material configured to assist in optically coupling the interposer 205 (e.g., the waveguide 212) with the adiabatic coupler 218. For example, the removable material may simulate epoxy and/or other materials that may be used to couple a device with the adiabatic coupler 218 after the wafer 102 has been diced. The removable material may include alcohol or any other appropriate index matching fluid or temporary material.

In some embodiments, the interposer 205 may include a mirror 220 located below the grating coupler 214. The mirror 220 may reduce degradation of the optical signal 216b being redirected by the grating coupler 214 by vertically redirecting portions of the optical signal 216b that are redirected downward by the grating coupler 214. The mirror 220 may include a distributed Bragg reflector (DBR) mirror, a metal mirror, or any other appropriate mirror for redirecting the optical signal 216b.

In some embodiments, the grating coupler 214 may be configured so as to redirect the optical signal 216b with a twenty to forty micrometers (μall) optical mode, which may reduce divergence of the optical signal 216b and/or may permit a thickness of the transparent layer 210 to be increased. For example, the thickness of the transparent layer 210 may be increased to 700 μm or greater. Additionally or alternatively, a thickness of the transparent layer 210 may be reduced so as to reduce beam divergence and/or improve efficiency of the optical component 208. For example, the thickness of the transparent layer 210 may be reduced to roughly 100 μm.

In some embodiments, the interposer 205 may include additional waveguides and/or grating couplers located proximate the transparent layer 210 and/or the waveguide 212. The additional waveguides and/or grating couplers may perform the same or similar functionalities as the waveguide 212 and/or the grating coupler 214.

The optical component 208, as illustrated in FIG. 2, is an optical fiber with the understanding that the optical component 208 may be any appropriate optical component 208. For example, the optical component 208 may include a photodetector, a photodiode, or an optical fiber.

Figure 3:
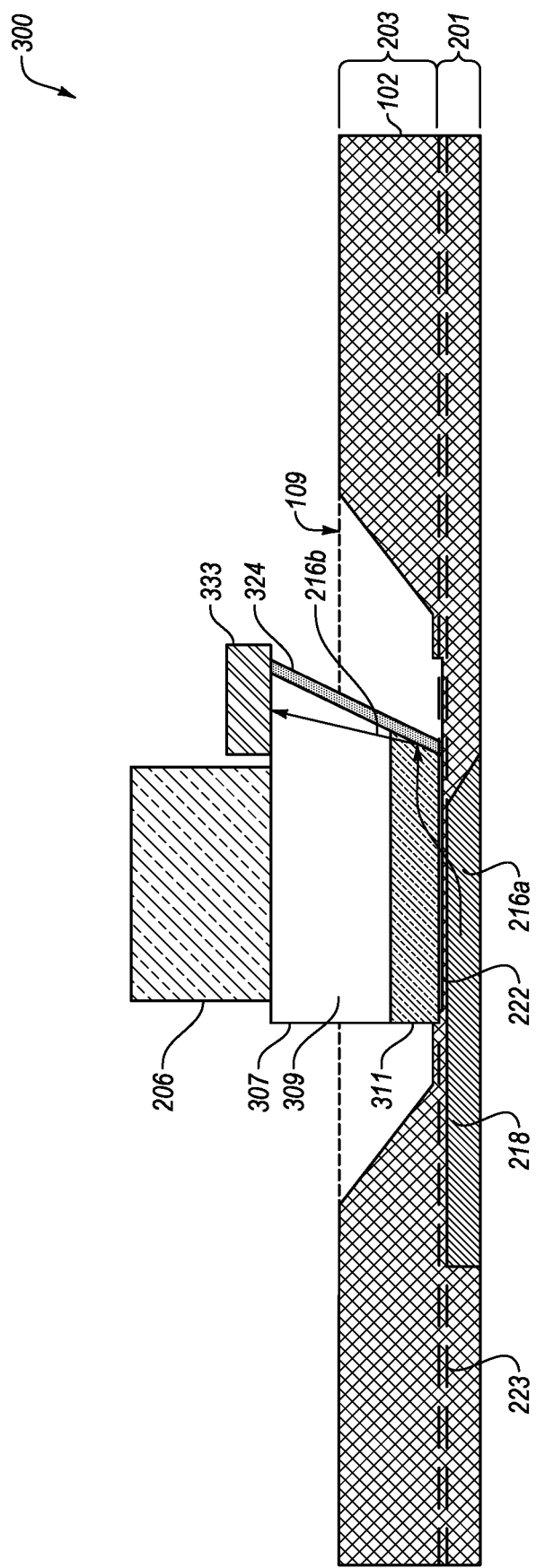
FIG. 3 illustrates a cross-sectional view of another photonic system including an interposer for wafer level testing of optical components located in the wafer of FIG. 1A.

FIG. 3 illustrates a cross-sectional view of another photonic system 300 (referenced in the present disclosure as 'system 300') including an interposer 307 for wafer level testing of optical components located in the wafer 102 of FIG. 1A, in accordance with at least one embodiment described in the present disclosure. The system 300 may include the wafer 102, the interposer 307, an optical component 333, and the testing fixture 206. The interposer 307 may be the same or similar to the interposer 104 discussed above in relation to FIG. 1A.

In some embodiments, the interposer 307 may include a transparent layer 309, a waveguide 311, and a mirror 324 (e.g., a redirecting element). The transparent layer 309 may operate the same as or similar to the transparent layer 210 discussed above in relation to FIG. 2. Likewise, the waveguide 311 may operate the same as or similar to the waveguide 212 discussed above in relation to FIG. 2.

The mirror 324 may be optically coupled to the waveguide 311 via the transparent layer 309. The mirror 324 may be located proximate the transparent layer 210 and the waveguide 311. Additionally, the interposer 307 may be configured to be placed within the cavity 109 so that the waveguide 311 is located proximate and optically coupled to the adiabatic coupler 218. Furthermore, the interposer 307 may be temporarily attached (e.g., bonded) to the wafer 102 during wafer level testing of the optical components located in the wafer 102. For example, the wafer 102 may include multiple optical modules (e.g., chips) and the interposer 307 may be moved between the various optical modules to test each optical module at the wafer level.

As illustrated in FIG. 3, the waveguide 311 may adiabatically couple the optical signal 216a (e.g., the received optical signal) out of the adiabatic coupler 218. The waveguide 311 may provide the optical signal 216a to the mirror 324. The mirror 324 may redirect the optical signal 216b (e.g., redirected optical signal) vertically towards the optical component 333. The optical signal 216b may traverse the transparent layer 309 prior to reaching the optical component 333.

In some embodiments, the mirror 324 may include an angled facet formed in the interposer 307. Alternatively or additionally, the mirror 324 may be angled at a forty five degree angle relative to an upper surface of the wafer 102. Additionally or alternatively, the mirror 324 may be arranged relative to the upper surface of the wafer 102 at an angle greater than or less than forty five degrees. In these embodiments, the mirror 324 may satisfy a total-internal-reflection condition and may provide high reflectivity without an additional high reflective coating. Alternatively, the mirror 324 (e.g., the angled facet of the interposer 307) may be coated with a metal or multilayer coating to provide high reflectivity.

In some embodiments, the optical component 333 may include a broad-area photo-detector. A broad-area photo-detector may be configured to more efficiently receive an optical signal with a larger optical mode than an optical fiber. The embodiment illustrated in FIG. 2 may redirect the optical signal 216b with a larger optical mode than in an embodiment where a grating coupler (e.g., the grating coupler 214 discussed above in relation to FIG. 2) is used. The optical component 333 as illustrated in FIG. 3 is a photo-detector with the understanding that the optical component 333 may be any appropriate optical component 333. For example, the optical component 333 may include a photo-detector, a photodiode, or an optical fiber.

Figure 4:
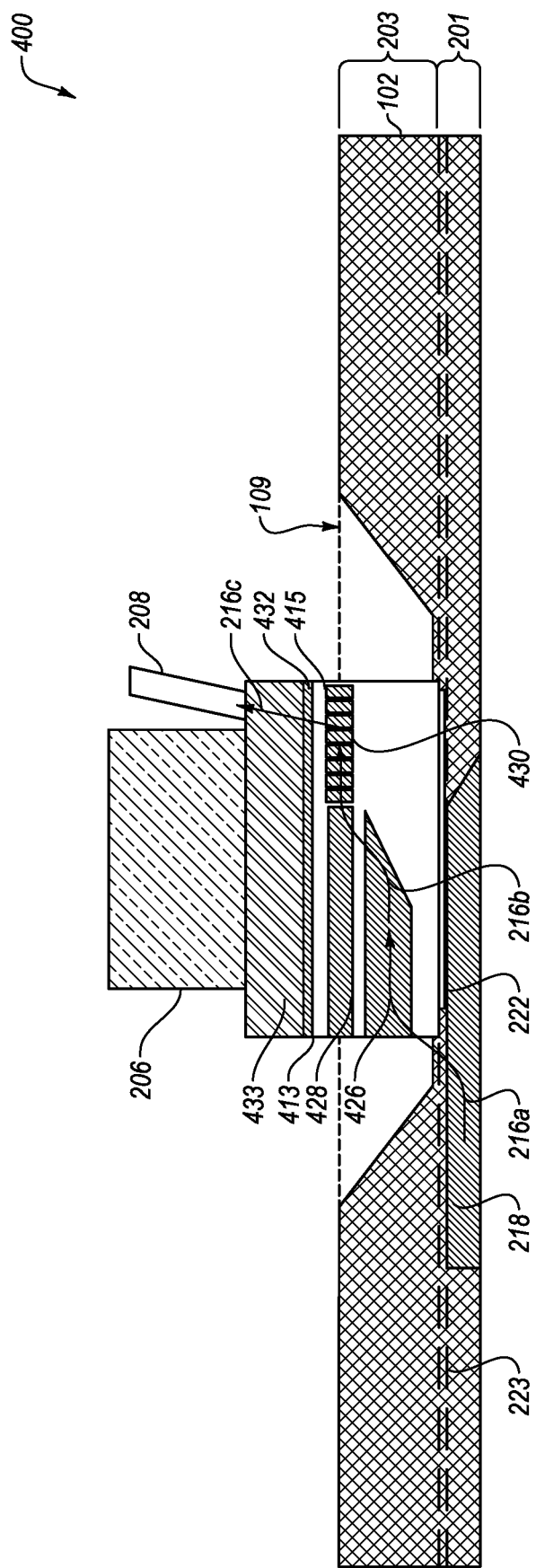
FIG. 4 illustrates a cross-sectional view of yet another photonic system including an interposer for wafer level testing of optical components located in the wafer of FIG. 1A.

FIG. 4 illustrates a cross-sectional view of yet another photonic system 400 (referenced in the present disclosure as 'system 400') including an interposer 413 for wafer level testing of optical components located in the wafer 102 of FIG. 1A, in accordance with at least one embodiment described in the present disclosure. The system 400 may include the wafer 102, the interposer 413, the optical component 208, and the testing fixture 206. The interposer 413 may be the same as or similar to the interposer 104 discussed above in relation to FIG. 1A.

In some embodiments, the interposer 413 may include a transparent layer 415, a first waveguide 426, a second waveguide 428, a grating coupler 430 (e.g., a redirecting element), an anti-reflection (AR) coating 432, and a thick substrate 433. The transparent layer 415 may operate the same as or similar to the transparent layer 210 and 309 discussed above in relation to FIGS. 2 and 3.

The grating coupler 430 may be optically coupled to the second waveguide 428. In addition, the grating coupler 430 may be optically coupled to the optical component 208 via at least a portion of the transparent layer 415, the AR coating 432, and the thick substrate 433. In addition, the optical component 208 may be located proximate the thick substrate 433. For example, the optical component 208 may be located proximate the thick substrate 433 such that the optical receiver is located vertically above the grating coupler 430.

The first waveguide 426, the second waveguide 428, and/or the grating coupler 430 may be located within the transparent layer 210. The AR coating 432 may be located on a top surface of the transparent layer 415 between the transparent layer 415 and the optical component 208 and/or the testing fixture 206. Further, the thick substrate 433 may be located on a top surface of the AR coating 432 between the AR coating 432 and the optical component 208 and/or the testing fixture 206.

Additionally, the interposer 413 may be configured to be placed within the cavity 109 so that the first waveguide 426 is located proximate and adiabatically coupled to the adiabatic coupler 218. Furthermore, the interposer 413 may be temporarily attached (e.g., bonded) to the wafer 102 during wafer level testing of the optical components located in the wafer 102. For example, the wafer 102 may include multiple optical modules (e.g., chips) and the interposer 413 may be moved between the various optical modules to test each optical module at the wafer level.

The AR coating 432 may include Si material, SiN material, or any other material appropriate for forming providing AR features. The AR coating 432 may be multilayer coating with different materials. The AR coating 432 may reduce the reflection on the interface between the transparent layer 415 and the thick substrate 433. The thick substrate 433 may be Si or other materials. For example, the thick substrate 433 may be configured to propagate the optical signals so as to permit the optical signals to traverse the thick substrate 433. In some embodiments, a surface of the thick substrate 433 may be optically smooth so as to prevent or reduce loss of the optical signals.

As illustrated in FIG. 4, the first waveguide 426 may adiabatically couple the optical signal 216a (e.g., the received optical signal) out of the adiabatic coupler 218. In some embodiments, the adiabatic coupler 218 may receive the optical signal 216a from an OIC, a PIC, a different adiabatic coupler, or any other appropriate optical component located in the wafer 102. The second waveguide 428 may adiabatically couple the optical signal 216b out of the first waveguide 426. The second waveguide 428 may provide the optical signal 216b to the grating coupler 430. The grating coupler 430 may redirect the optical signal 216c (e.g., redirected optical signal) vertically towards the optical component 208. The optical signal 216c may traverse the transparent layer 415, the AR coating 432, and the thick substrate 433 prior to reaching the optical component 208.

Additionally or alternatively, optical signals may be processed by the system 300 in the reverse direction. For example, the testing fixture 206 may provide an optical signal (e.g., a transmitted optical signal). The optical signal may traverse the thick substrate 433 and the AR coating 432 and may be received by the grating coupler 430. The grating coupler 430 may redirect the optical signal horizontally and provide the optical signal to the second waveguide 428. The optical signal may be adiabatically coupled into the first waveguide 426. The optical signal may be adiabatically coupled into the adiabatic coupler 218 from the first waveguide 426.

In some embodiments, the first waveguide 426 may be configured as a high contrast waveguide. In these and other embodiments, the first waveguide 426 may include SiN material, SiON material, or any other suitable high contrast material. Additionally, the second waveguide 428 may be configured as a low contrast waveguide. In these and other embodiments, the second waveguide 428 may include SiN material, SiON material, or any other suitable low contrast material. The grating coupler 430 may include SiN material, SiON material, or any other material suitable for forming the grating coupler 430.

In some embodiments, measurements may be taken to ensure that the interposer 413 is positioned parallel relative to the adiabatic coupler 218. For example, proximity sensors may be used to measure gaps between the interposer 413 and the wafer 102 in multiple locations. If the gap difference is between zero and two hundred nm, the interposer 413 may be determined to be parallel to the adiabatic coupler 218. As another example, reference waveguide loops may ensure that the interposer 413 is positioned parallel relative to the adiabatic coupler 218.

Figure 5:
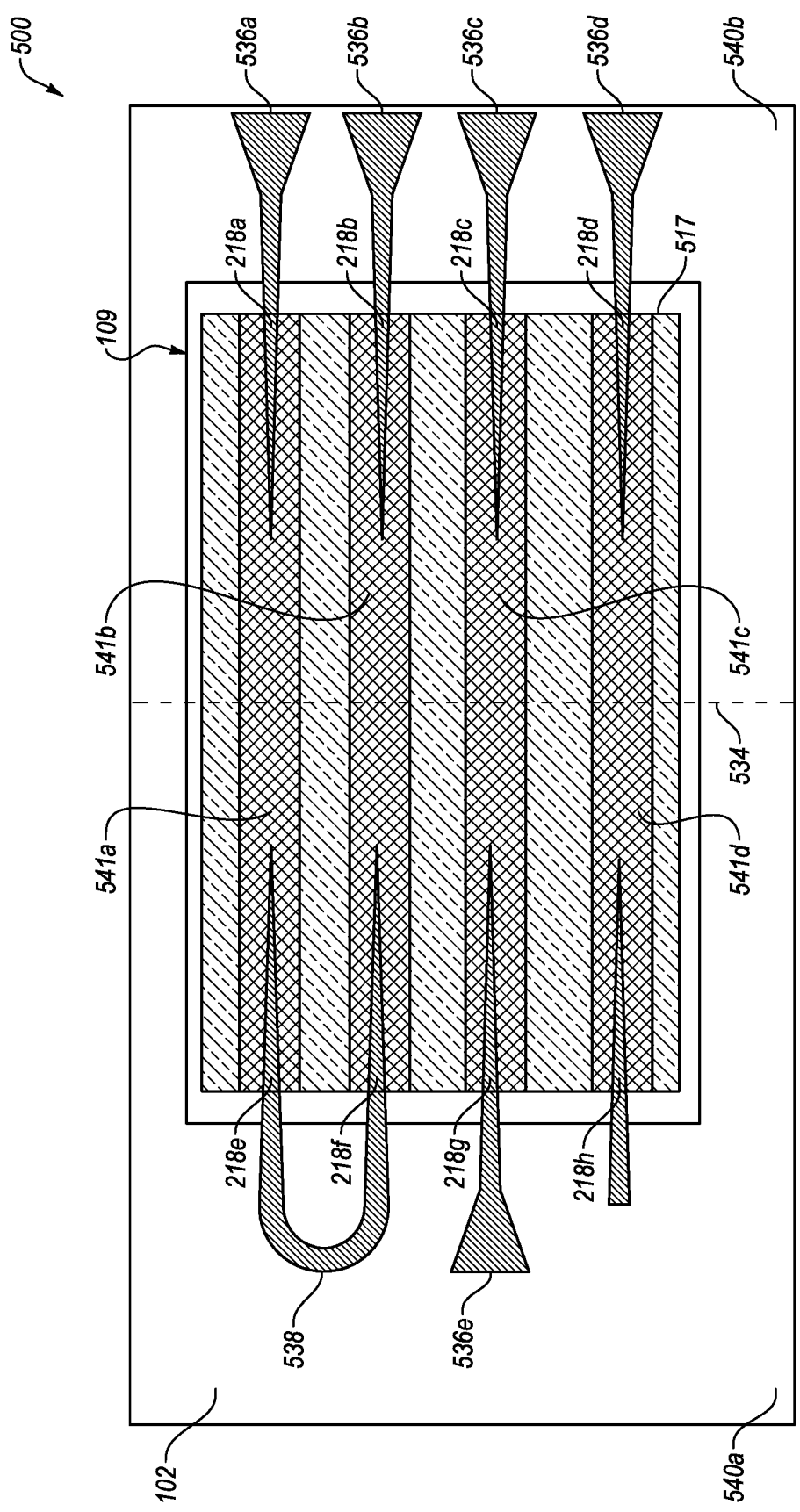
FIG. 5 illustrates a cross-sectional top view of a photonic system including an interposer for wafer level testing of optical components located in the wafer of FIG. 1A.

FIG. 5 illustrates a cross-sectional top view of a photonic system 500 (referenced in the present disclosure as 'system 500') including an interposer 517 for wafer level testing of optical components located in the wafer 102 of FIG. 1A, in accordance with at least one embodiment described in the present disclosure.

In some embodiments, the wafer 102 may include a first chip 540a and a second chip 540b (collectively chips 540 and/or generically chip 540). An edge of the first chip 540a and an edge of the second chip 540b may define a dicing lane 534 where, post processing, the wafer 102 may be diced to expose an edge of adiabatic couplers 218a-h in the first chip 540a and the second chip 540b. The cavity 109 may be defined so as to extend across the dicing lane 534.

The second chip 540b may include a first adiabatic coupler 218a, a second adiabatic coupler 218b, a third adiabatic coupler 218c, and a fourth adiabatic coupler 218d. The second chip 540b may also include a first grating coupler 536a, a second grating coupler 536b, a third grating coupler 536c, and a fourth grating coupler 536d. The cavity 109 may be defined so as to optically expose the adiabatic couplers 218a-d located in the second chip 540b.

The first chip 540a may include a fifth adiabatic coupler 218e, a sixth adiabatic coupler 218f, a seventh adiabatic coupler 218g, and an eighth adiabatic coupler 218h. The first chip 540a may also include a curved waveguide 538 and a fifth grating coupler 536e. In some embodiments, the curved waveguide 538 may optically couple the fifth adiabatic coupler 218e to the sixth adiabatic coupler 218f. The cavity 109 may also be defined so as to optically expose the adiabatic couplers 218e-h located in the first chip 540a.

The interposer 517 may include a first waveguide 541a, a second waveguide 541b, a third waveguide 541c, and a fourth waveguide 541d. The interposer 517 may be configured so as to be placed in the cavity 109. When the interposer 517 is placed in the cavity 109, the first waveguide 541a may be located proximate the first adiabatic coupler 218a and the fifth adiabatic coupler 218e so as to optically couple the first adiabatic coupler 218a with the fifth adiabatic coupler 218e. Also, the second waveguide 541b may be located proximate the second adiabatic coupler 218b and the sixth adiabatic coupler 218f so as to optically couple the second adiabatic coupler 218b with the sixth adiabatic coupler 218f. Likewise, the third waveguide 541c may be located proximate the third adiabatic coupler 218c and the seventh adiabatic coupler 218g so as to optically couple the third adiabatic coupler 218c with the seventh adiabatic coupler 218g. Furthermore, the fourth waveguide 541d may be located proximate the fourth adiabatic coupler 218d and the eighth adiabatic coupler 218h so as to optically couple the fourth adiabatic coupler 218d with the eighth adiabatic coupler 218h.

In some embodiments, one or more optical signals may be provided to and/or received from one or more of the grating couplers 536a-e. The one or more optical signals may propagate through various optical components in the wafer 102 and/or the interposer 517.

In some embodiments, the interposer 517 may be permanently attached (e.g., bonded) to the wafer 102. For example, the wafer 102 may include multiple chips 540 and a fiber array may test one or more of the chips 540 located in the wafer 102. For example, the fiber array may provide one or more optical signals to the grating couplers 536a-e as discussed below. After testing each of the chips 540, the wafer 102 and the interposer 517 may be diced along the dicing lane 534. In some embodiments, the interposer 104 may be temporarily attached (e.g., bonded) to the wafer 102.

In some embodiments, a first optical signal may be provided to the first grating coupler 536a. The first optical signal may be received by the first adiabatic coupler 218a from the first grating coupler 536a. The first waveguide 541a may adiabatically couple the first optical signal out of the first adiabatic coupler 218a. Additionally, the first waveguide 541a may adiabatically couple the first optical signal into the fifth adiabatic coupler 218e. The curved waveguide 538 may receive the first optical signal from the fifth adiabatic coupler 218e and may provide the first optical signal to the sixth adiabatic coupler 218f. The second waveguide 541b may adiabatically couple the first optical signal out of the sixth adiabatic coupler 218f. The second waveguide 541b may adiabatically couple the first optical signal into the second adiabatic coupler 218b. The second grating coupler 536b may receive the first optical signal from the second adiabatic coupler 218b and may provide the first optical signal to an optical receiver. Additionally or alternatively, the first optical signal may propagate through the various optical components in the reverse direction.

In some embodiments, a second optical signal may be provided to the third grating coupler 536c. The second optical signal may be received by the third adiabatic coupler 218c from the third grating coupler 536c. The third waveguide 541c may adiabatically couple the second optical signal out of the third adiabatic coupler 218c. Additionally, the third waveguide 541c may adiabatically couple the second optical signal into the seventh adiabatic coupler 218g. The fifth grating coupler 536e may receive the second optical signal from the seventh adiabatic coupler 218g and may provide the second optical signal to an optical receiver. Alternatively, the second optical signal may propagate through the various optical components in the reverse direction.

In some embodiments, a third optical signal may be provided to the fourth grating coupler 536d. The third optical signal may be received by the fourth adiabatic coupler 218d from the fourth grating coupler 536d. The fourth waveguide 541d may adiabatically couple the third optical signal out of the fourth adiabatic coupler 218d. The fourth waveguide 541d may adiabatically couple the third optical signal into the eighth adiabatic coupler 218h. The eighth adiabatic coupler 218h may provide the third optical signal to an OIC and/or a PIC located in the first chip 540a.

The various optical signals (e.g., the first optical signal, the second optical signal, and/or the third optical signal) may be used to determine whether the various optical components are operating properly. For example, the signal strength of the first optical signal provided by the second grating coupler 536b may be measured to determine optical loss through the first grating coupler 536a, the first adiabatic coupler 218a, the fifth adiabatic coupler 218e, the curved waveguide 538, the sixth adiabatic coupler 218f, and the second adiabatic coupler 218b, and the second grating coupler 536b. As another example, the signal quality of the second optical signal provided by the fifth grating coupler 536e may be used to determine signal degradation in the third grating coupler 536c, the third adiabatic coupler 218c, the seventh adiabatic coupler 218g, and the fifth grating coupler 536e.

In some embodiments, including back-to-back adiabatic couplers (e.g., the first and fifth adiabatic couplers 218a and 218e are back-to-back adiabatic couplers) as illustrated in FIG. 5 (may make an area of the cavity 109 increase compared to embodiments that lack back-to-back adiabatic couplers. For example, a length of the cavity 109 (measured left-to-right or right-to-left in FIG. 5) may be substantially six millimeters (mm) instead of substantially three mm in other embodiments that lack back-to-back adiabatic couplers.

Figure 6:
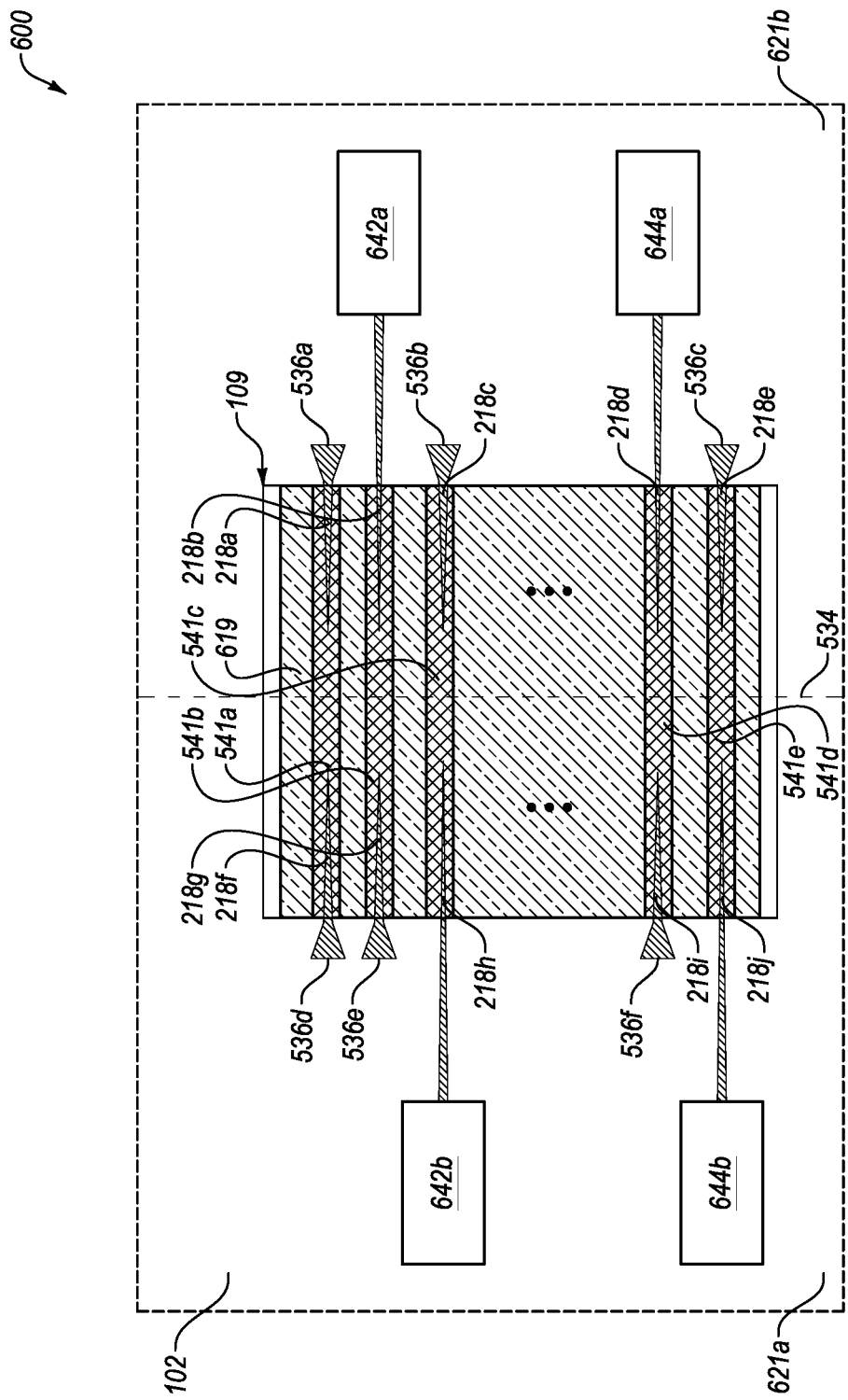
FIG. 6 illustrates a cross-sectional top view of another photonic system including an interposer for wafer level testing of optical components located in the wafer of FIG. 1A.

FIG. 6 illustrates a cross-sectional top view of another photonic system 600 (referenced in in the present disclosure as 'system 600') including an interposer 619 for wafer level testing of optical components located in the wafer 102 of FIG. 1A, in accordance with at least one embodiment described in the present disclosure.

In some embodiments, the wafer 102 may include a first chip 621a and a second chip 612b (referenced collectively in the present disclosure as "chips 621"). An edge of the first chip 621a and an edge of the second chip 621b may define the dicing lane 534 where, post processing, the wafer 102 may be diced exposing an edge of adiabatic couplers 218a-j in the first chip 621a and the second chip 621b.

The second chip 621b may include a first adiabatic coupler 218a, a second adiabatic coupler 218b, a third adiabatic coupler 218c, a fourth adiabatic coupler 218d, and a fifth adiabatic coupler 218e. The second chip 621b may also include a first grating coupler 536a, a second grating coupler 536b, and a third grating coupler 536c. Additionally, the second chip 621b may include a first transmit port 642a and a first receive port 644a. The cavity 109 may be defined so as to optically expose the adiabatic couplers 218a-e located in the second chip 621b.

The first chip 621a may include a sixth adiabatic coupler 218f, a seventh adiabatic coupler 218g, an eighth adiabatic coupler 218h, a ninth adiabatic coupler 218i, and a tenth adiabatic coupler 218j. The first chip 621a may also include a fourth grating coupler 536d, a fifth grating coupler 536e, and a sixth grating coupler 536f. Additionally, the first chip 621a may include a second transmit port 642b and a second receive port 644b. The cavity 109 may also be defined so as to optically expose the adiabatic couplers 218f-h located in the first chip 621a.

The interposer 619 may include a first waveguide 541a, a second waveguide 541b, a third waveguide 541c, a fourth waveguide 541d, and a fifth waveguide 541e. The interposer 619 may be configured so as to be placed in the cavity 109. When the interposer 619 is placed in the cavity 109, the first waveguide 541a may be located proximate the first adiabatic coupler 218a and the sixth adiabatic coupler 218f so as to optically couple the first adiabatic coupler 218a with the sixth adiabatic coupler 218f. Also, the second waveguide 541b may be located proximate the second adiabatic coupler 218b and the seventh adiabatic coupler 218g so as to optically couple the second adiabatic coupler 218b with the seventh adiabatic coupler 218g. Likewise, the third waveguide 541c may be located proximate the third adiabatic coupler 218c and the eighth adiabatic coupler 218h so as to optically couple the third adiabatic coupler 218c with the eighth adiabatic coupler 218h. Furthermore, the fourth waveguide 541d may be located proximate the fourth adiabatic coupler 218d and the ninth adiabatic coupler 218i so as to optically couple the fourth adiabatic coupler 218d with the ninth adiabatic coupler 218i. The fifth waveguide 541e may be located proximate the fifth adiabatic coupler 218e and the tenth adiabatic coupler 218j so as to optically couple the fifth adiabatic coupler 218e with the tenth adiabatic coupler 218j.

In some embodiments, one or more optical signals may be provided to and/or received from one or more of the grating couplers 536a-f. The one or more optical signals may propagate through various optical components in the wafer 102 and/or the interposer 619.

In some embodiments, the interposer 619 may be permanently attached (e.g., bonded) to the wafer 102. For example, the wafer 102 may include the multiple chips 621 and a fiber array may be used to test one or more of the chips 540 located in the wafer 102. For example, the fiber array may provide one or more optical signals to the grating couplers 536a-f as discussed below. After testing each of the chips 621, the wafer 102 and the interposer 619 may be diced along the dicing lane 534. In some embodiments, the interposer 104 may be temporarily attached (e.g., bonded) to the wafer 102.

In some embodiments, a first optical signal may be provided to the first grating coupler 536a. The first optical signal may be received by the first adiabatic coupler 218a from the first grating coupler 536a. The first waveguide 541a may adiabatically couple the first optical signal out of the first adiabatic coupler 218a. Additionally, the first waveguide 541a may adiabatically couple the first optical signal into the sixth adiabatic coupler 218f. The fourth grating coupler 536d may receive the first optical signal from the sixth adiabatic coupler 218f and the fourth grating coupler 536d may provide the first optical signal to an optical receiver. Additionally or alternatively, the first optical signal may propagate through the various optical components in the reverse direction.

In some embodiments, a second optical signal may be provided to the third grating coupler 536c. The second optical signal may be received by the fifth adiabatic coupler 218e from the third grating coupler 536c. The fifth waveguide 541e may adiabatically couple the second optical signal out of the fifth adiabatic coupler 218e. Additionally, the fifth waveguide 541e may adiabatically couple the second optical signal into the tenth adiabatic coupler 218j. The tenth adiabatic coupler 218j may provide the second optical signal to the second receive port 644b. The second optical signal may propagate through an optical circuit (e.g., an OIC or a PIC) optically coupled to the second receive port 644b and the second transmit port 642b. The second transmit port 642b may provide the second optical signal to the eighth adiabatic coupler 218h. The third waveguide 541c may adiabatically couple the second optical signal out of the eighth adiabatic coupler 218h. Likewise, the third waveguide 541c may adiabatically couple the second optical signal into the third adiabatic coupler 218c. The third adiabatic coupler 218c may provide the second optical signal to the second grating coupler 536b, which may provide the second optical signal to an optical receiver.

In some embodiments, a third optical signal may be provided to the sixth grating coupler 536f. The third optical signal may be received by the ninth adiabatic coupler 218i from the sixth grating coupler 536f. The fourth waveguide 541d may adiabatically couple the third optical signal out of the ninth adiabatic coupler 218i. Additionally, the fourth waveguide 541d may adiabatically couple the third optical signal into the fourth adiabatic coupler 218d. The fourth adiabatic coupler 218d may provide the third optical signal to the first receive port 644a. The third optical signal may propagate through an optical circuit (e.g., an OIC or a PIC) optically coupled to the first receive port 644a and the first transmit port 642a. The first transmit port 642a may provide the third optical signal to the second adiabatic coupler 218b. The second waveguide 541b may adiabatically couple the third optical signal out of the second adiabatic coupler 218b. Likewise, the second waveguide 541b may adiabatically couple the third optical signal into the seventh adiabatic coupler 218g. The seventh adiabatic coupler 218g may provide the third optical signal to the fifth grating coupler 536e, which may provide the third optical signal to an optical receiver.

The dots illustrated in FIG. 6 indicate that additional waveguides and/or additional adiabatic couplers may be included in the interposer 619 and/or the wafer 102. The additional waveguides and/or the additional adiabatic couplers may operate in the same or similar manner as the waveguides 541a-e and/or the adiabatic couplers 218a-j.

Figure 7:
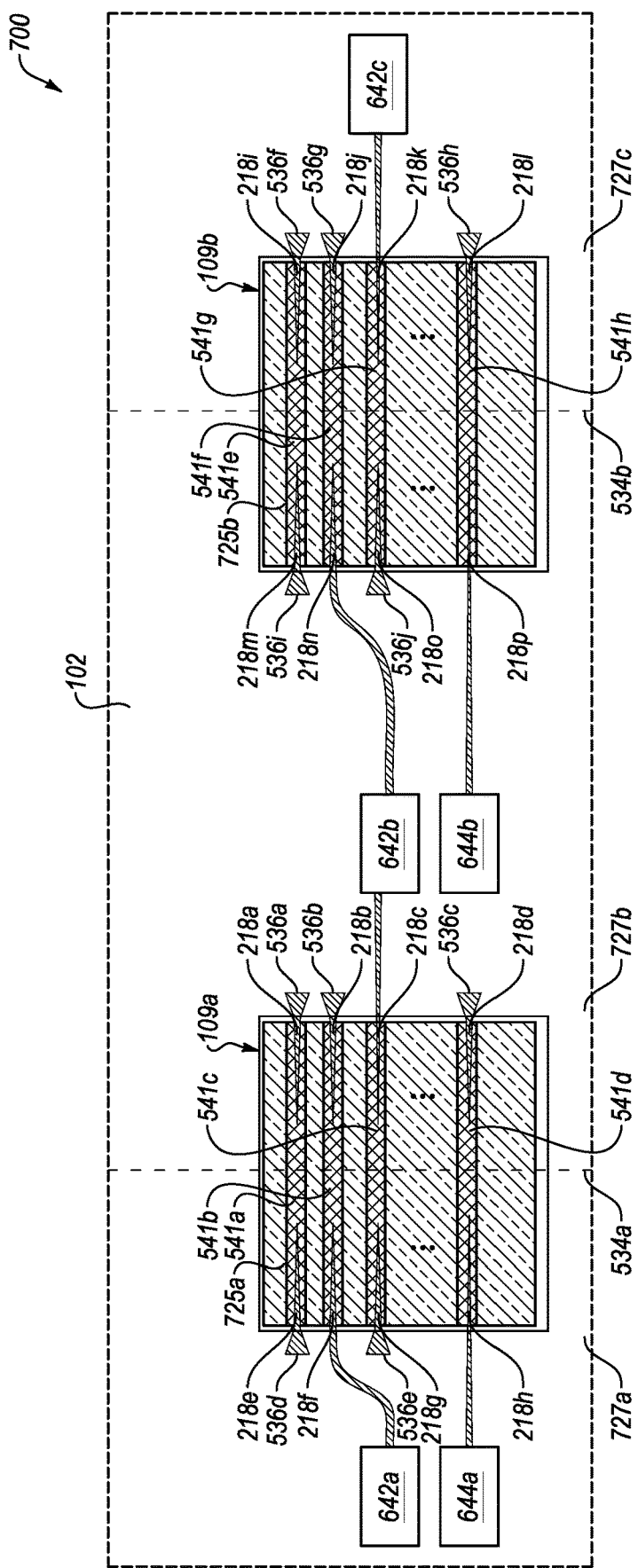
FIG. 7 illustrates a cross-sectional top view of yet another photonic system including a first interposer and a second interposer for wafer level testing of optical components located in the wafer of FIG. 1A.

FIG. 7 illustrates a cross-sectional top view of yet another photonic system 700 (referenced in in the present disclosure as 'system 700') including a first interposer 725a and a second interposer 725b for wafer level testing of optical components located in the wafer 102 of FIG. 1A, in accordance with at least one embodiment described in the present disclosure.

In some embodiments, the wafer 102 may include a first chip 727a, a second chip 727b, and a third chip 727c (referenced collectively in the present disclosure as "chips 727"). Additionally, the wafer 102 may define a first cavity 109a and a second cavity 109b. An edge of the first chip 727a and an edge of the second chip 727b may define a first dicing lane 534a where, post processing, the wafer 102 may be diced exposing an edge of adiabatic couplers 218a-h in the first chip 727a and the second chip 727b proximate the first dicing lane 534a. Additionally, an edge of the second chip 727b and an edge of the third chip 727c may define a second dicing lane 534b where, post processing, the wafer 102 may be diced exposing an edge of adiabatic couplers 218i-p second chip 727b and the third chip 727c proximate the second dicing lane 534b. The first cavity 109a may be defined so as to extend across the first dicing lane 534a. The second cavity 109b may be defined so as to extend across the second dicing lane 534b.

The second chip 727b may include a first adiabatic coupler 218a, a second adiabatic coupler 218b, a third adiabatic coupler 218c, and a fourth adiabatic coupler 218d located proximate the first cavity 109a. The second chip 727b may also include a first grating coupler 536a, a second grating coupler 536b, and a third grating coupler 536c located proximate the first cavity 109a. The second chip 727b may also include a thirteenth adiabatic coupler 218m, a fourteenth adiabatic coupler 218n, a fifteenth adiabatic coupler 218o, and a sixteenth adiabatic coupler 218p located proximate the second cavity 109b. Likewise, the second chip 727b may include a ninth grating coupler 536i and a tenth grating coupler 536j located proximate the second cavity 109b. Additionally, the second chip 727b may include a second transmit port 642b and a second receive port 644b. The first cavity 109a may be defined so as to optically expose the adiabatic couplers 218a-d located in the second chip 727b proximate the first cavity 109a. The second cavity 109b may be defined so as to optically expose the adiabatic couplers 218m-p located in the second chip 727b proximate the second cavity 109b.

In some embodiments, the thirteenth adiabatic coupler 218m, the fourteenth adiabatic coupler 218n, the fifteenth adiabatic coupler 218o, and the sixteenth adiabatic coupler 218p may include laser adiabatic couplers. Additionally, the first adiabatic coupler 218a, the second adiabatic coupler 218b, the third adiabatic coupler 218c, and the fourth adiabatic coupler 218d may include fiber adiabatic couplers. In some embodiments, laser adiabatic couplers may include an optical mode size that better overlaps the optical signals (e.g., laser beam).

The first chip 727a may include a fifth adiabatic coupler 218e, a sixth adiabatic coupler 218f, a seventh adiabatic coupler 218g, and an eighth adiabatic coupler 218h located proximate the first cavity 109a. The first chip 727a may also include a fourth grating coupler 536d and a fifth grating coupler 536e located proximate the first cavity 109a. Additionally, the first chip 727a may include a first transmit port 642a and a first receive port 644a. The first cavity 109a may be defined so as to optically expose the adiabatic couplers 218e-h located in the first chip 727a.

In some embodiments, the fifth adiabatic coupler 218e, the sixth adiabatic coupler 218f, the seventh adiabatic coupler 218g, and the eighth adiabatic coupler 218h may include laser adiabatic couplers.

The third chip 727c may include a ninth adiabatic coupler 218i, a tenth adiabatic coupler 218j, an eleventh adiabatic coupler 218k, and a twelfth adiabatic coupler 218l located proximate the second cavity 109b. The third chip 727c may also include a sixth grating coupler 536f, a seventh grating coupler 536g, and an eighth grating coupler 536h located proximate the second cavity 109b. Additionally, the first chip 727a may include a third transmit port 642c. The second cavity 109b may be defined so as to optically expose the adiabatic couplers 218i-l located in the third chip 727c.

In some embodiments, the ninth adiabatic coupler 218i, the tenth adiabatic coupler 218j, the eleventh adiabatic coupler 218k, and the twelfth adiabatic coupler 218l may include fiber adiabatic couplers.

The first interposer 725a may include a first waveguide 541a, a second waveguide 541b, a third waveguide 541c, and a fourth waveguide 541d. The first interposer 725a may be configured so as to be placed in the first cavity 109a. When the first interposer 725a is placed in the first cavity 109a, the first waveguide 541a may be located proximate the first adiabatic coupler 218a and the fifth adiabatic coupler 218e so as to optically couple the first adiabatic coupler 218a with the fifth adiabatic coupler 218e. Also, the second waveguide 541b may be located proximate the second adiabatic coupler 218b and the sixth adiabatic coupler 218f so as to optically couple the second adiabatic coupler 218b with the sixth adiabatic coupler 218f. Likewise, the third waveguide 541c may be located proximate the third adiabatic coupler 218c and the seventh adiabatic coupler 218g so as to optically couple the third adiabatic coupler 218c with the seventh adiabatic coupler 218g. Furthermore, the fourth waveguide 541d may be located proximate the fourth adiabatic coupler 218d and the eighth adiabatic coupler 218h so as to optically couple the fourth adiabatic coupler 218d with the eighth adiabatic coupler 218h.

The second interposer 725b may include a fifth waveguide 541e, a sixth waveguide 541f, a seventh waveguide 541g, and an eighth waveguide 541h. The second interposer 725b may be configured so as to be placed in the second cavity 109b. When the second interposer 725b is placed in the second cavity 109b, the fifth waveguide 541e may be located proximate the ninth adiabatic coupler 218i and the thirteenth adiabatic coupler 218m so as to optically couple the ninth adiabatic coupler 218i with the thirteenth adiabatic coupler 218m. Also, the sixth waveguide 541f may be located proximate the tenth adiabatic coupler 218j and the fourteenth adiabatic coupler 218n so as to optically couple the tenth adiabatic coupler 218j with the fourteenth adiabatic coupler 218n. Likewise, the seventh waveguide 541g may be located proximate the eleventh adiabatic coupler 218k and the fifteenth adiabatic coupler 218o so as to optically couple the eleventh adiabatic coupler 218k with the fifteenth adiabatic coupler 218o. Furthermore, the eighth waveguide 541h may be located proximate the twelfth adiabatic coupler 218l and the sixteenth adiabatic coupler 218p so as to optically couple the twelfth adiabatic coupler 218l with the sixteenth adiabatic coupler 218p.

In some embodiments, one or more optical signals may be provided to and/or received from one or more of the grating couplers 536a-h. The one or more optical signals may propagate through various optical components in the wafer 102 and/or the interposers 725a-b.

In some embodiments, the interposers 725a-b may be permanently attached (e.g., bonded) to the wafer 102. For example, the wafer 102 may include the multiple chips 540 and a fiber array may be used to test each of the chips 727 located in the wafer 102. For example, the fiber array may provide one or more optical signals to the grating couplers 536a-h as discussed below. After testing each of the chips 540, the wafer 102 and the interposers 725a-b may be diced along the dicing lanes 534a-b. In some embodiments, the interposers 725a-b 104 may be temporarily attached (e.g., bonded) to the wafer 102.

In some embodiments, a first optical signal may be provided to the first grating coupler 536a. The first optical signal may be received by the first adiabatic coupler 218a from the first grating coupler 536a. The first waveguide 541a may adiabatically couple the first optical signal out of the first adiabatic coupler 218a. Additionally, the first waveguide 541a may adiabatically couple the first optical signal into the fifth adiabatic coupler 218e. The fifth grating coupler 536e may receive the first optical signal from the fifth adiabatic coupler 218e and the fifth grating coupler 536e may provide the first optical signal to an optical receiver. Additionally or alternatively, the first optical signal may propagate the various optical components in the reverse direction.

In some embodiments, a second optical signal may be provided to the third grating coupler 536c. The second optical signal may be received by the fourth adiabatic coupler 218d from the third grating coupler 536c. The fourth waveguide 541d may adiabatically couple the second optical signal out of the fourth adiabatic coupler 218d. Additionally, the fourth waveguide 541d may adiabatically couple the second optical signal into the eighth adiabatic coupler 218h. The eighth adiabatic coupler 218h may provide the second optical signal to the first receive port 644a. The second optical signal may propagate through an optical circuit (e.g., an OIC or a PIC) optically coupled to the first receive port 644a and the first transmit port 642a. The first transmit port 642a may provide the second optical signal to the sixth adiabatic coupler 218f. The second waveguide 541b may adiabatically couple the second optical signal out of the sixth adiabatic coupler 218f. Likewise, the second waveguide 541b may adiabatically couple the second optical signal into the second adiabatic coupler 218b. The second adiabatic coupler 218b may provide the second optical signal to the second grating coupler 536b, which may provide the second optical signal to an optical receiver.

In some embodiments, a third optical signal may be provided to the sixth grating coupler 536f. The third optical signal may be received by the ninth adiabatic coupler 218i from the sixth grating coupler 536f. The fifth waveguide 541e may adiabatically couple the third optical signal out of the ninth adiabatic coupler 218i. Additionally, the fifth waveguide 541e may adiabatically couple the third optical signal into the thirteenth adiabatic coupler 218m. The ninth grating coupler 536i may receive the third optical signal from the thirteenth adiabatic coupler 218m and the ninth grating coupler 536i may provide the third optical signal to an optical receiver. Additionally or alternatively, the third optical signal may propagate the various optical components in the reverse direction.

In some embodiments, a fourth optical signal may be provided to the eighth grating coupler 536h. The fourth optical signal may be received by the twelfth adiabatic coupler 218l from the eighth grating coupler 536h. The eighth waveguide 541h may adiabatically couple the fourth optical signal out of the twelfth adiabatic coupler 218l. Additionally, the eighth waveguide 541h may adiabatically couple the fourth optical signal into the sixteenth adiabatic coupler 218p. The sixteenth adiabatic coupler 218p may provide the fourth optical signal to the second receive port 644b. The fourth optical signal may propagate through an optical circuit (e.g., an OIC or a PIC) optically coupled to the second receive port 644b and the second transmit port 642b.

The second transmit port 642b may provide the fourth optical signal to one or both of the fourteenth adiabatic coupler 218n and the third adiabatic coupler 218c. The third waveguide 541c may adiabatically couple the fourth optical signal out of the third adiabatic coupler 218c. The third waveguide 541c may also adiabatically couple the fourth optical signal into the seventh adiabatic coupler 218g. The seventh adiabatic coupler 218g may provide the fourth optical signal to the fifth grating coupler 536e, which may provide the fourth optical signal to an optical receiver. Additionally or alternatively, the sixth waveguide 541f may adiabatically couple the fourth optical signal out of the fourteenth adiabatic coupler 218n. The sixth waveguide 541f may also adiabatically couple the fourth optical signal into the tenth adiabatic coupler 218j. The tenth adiabatic coupler 218j may provide the fourth optical signal to the seventh grating coupler 536g, which may provide the fourth optical signal to an optical receiver.

In some embodiments, a fifth optical signal may be provided to the third transmit port 642c. The fifth optical signal may be received by the eleventh adiabatic coupler 218k from the third transmit port 642c. The seventh waveguide 541g may adiabatically couple the fifth optical signal out of the eleventh adiabatic coupler 218k. Additionally, the seventh waveguide 541g may adiabatically couple the fifth optical signal into the fifteenth adiabatic coupler 218o. The fifteenth adiabatic coupler 218o may provide the fifth optical signal to the ninth grating coupler 536i, which may provide the fifth optical signal to an optical receiver.

In some embodiments, the wafer 102 may include more than three chips 727. For example, the wafer 102 may include 1,000 chips 727. As another example, the wafer 102 may include more than three chips 727 but fewer than 1,000 chips 727. In these and other embodiments, each of the chips 727 may be the same as or similar to the second chip 727b and may be optically coupled to one or more other chips 727 that are located proximate to each other. For example, the first chip 727a and the third chip 727c may be the same as or similar to the second chip 727b. The first chip 727a may be optically coupled to another chip 727 located proximate the first chip 727a on the left. Likewise, the third chip 727c may be optically coupled to another chip 727 located proximate the third chip 727c on the right. In these and other embodiments, the chips 727 may be optically coupled forming a chain of chips 727. The various optical signals may propagate the chain of chips 727 to test various optical components in each of the chips 727. In some embodiments, each of the chips 727 in the wafer 102 may be tested by providing and receiving optical signals from adjacent/proximate chips 727 located left and/or right of each of the chips 727 in the same or similar way as the second chip 727b discussed above.

The dots illustrated in FIG. 7 indicate that additional waveguides and/or additional adiabatic couplers may be included in the first interposer 725a, the second interposer 725b, and/or the wafer 102. The additional waveguides and/or the additional adiabatic couplers may operate in the same or similar manner as the waveguides 541a-h and/or the adiabatic couplers 218a-p.

Figure 8:
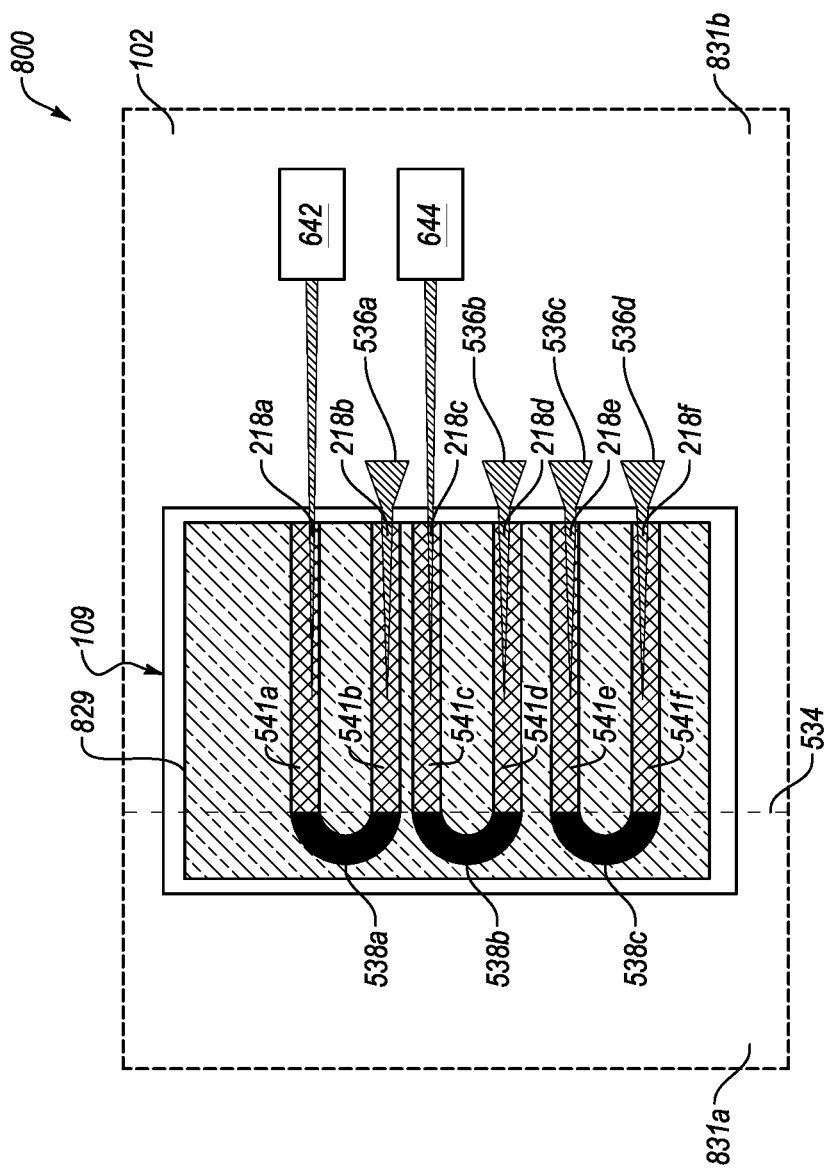
FIG. 8 illustrates a cross-sectional top view of a photonic system including an interposer for wafer level testing of optical components located in the wafer of FIG. 1A.

FIG. 8 illustrates a cross-sectional top view of a photonic system 800 (referenced in the present disclosure as 'system 800') including an interposer 829 for wafer level testing of optical components located in the wafer 102 of FIG. 1A, in accordance with at least one embodiment described in the present disclosure.

In some embodiments, the wafer 102 may include a first chip 831a and a second chip 831b (referenced collectively in the present disclosure as "chips 831"). An edge of the first chip 831a and an edge of the second chip 831b may define the dicing lane 534.

The second chip 831b may include a first adiabatic coupler 218a, a second adiabatic coupler 218b, a third adiabatic coupler 218c, a fourth adiabatic coupler 218d, a fifth adiabatic coupler 218e, and a sixth adiabatic coupler 218f. The second chip 831b may also include a first grating coupler 536a, a second grating coupler 536b, a third grating coupler 536c, and a fourth grating coupler 536d. Additionally, the second chip 831b may include a transmit port 642 and a receive port 644. The cavity 109 may be defined so as to optically expose the adiabatic couplers 218a-f located in the second chip 831b.

The interposer 829 may include a first waveguide 541a, a second waveguide 541b, a third waveguide 541c, a fourth waveguide 541d, a fifth waveguide 541e, and a sixth waveguide 541f. The interposer 829 may also include a first curved waveguide 538a, a second curved waveguide 538b, and a third curved waveguide 538c. The first curved waveguide 538a may optically couple the first waveguide 541a with the second waveguide 541b. The second curved waveguide 538b may optically couple the third waveguide 541c with the fourth waveguide 541d. The third curved waveguide 538c may optically couple the fifth waveguide 541e with the sixth waveguide 541f.

When the interposer 829 is placed in the cavity 109, the first waveguide 541a may be located proximate the first adiabatic coupler 218a and the second waveguide 541b may be located proximate the second adiabatic coupler so as to optically couple the first adiabatic coupler 218a with the second adiabatic coupler 218b. Also, the third waveguide 541c may be located proximate the third adiabatic coupler 218c and the fourth waveguide 541d may be located proximate the fourth adiabatic coupler 218d so as to optically couple the third adiabatic coupler 218c with the fourth adiabatic coupler 218d. Likewise, the fifth waveguide 541e may be located proximate the fifth adiabatic coupler 218e and the sixth waveguide 541f may be located proximate the sixth adiabatic coupler 218f so as to optically couple the fifth adiabatic coupler 218e with the sixth adiabatic coupler 218f.

In some embodiments, one or more optical signals may be provided to and/or received from one or more of the grating couplers 536a-d. The one or more optical signals may propagate through various optical components in the wafer 102 and/or the interposer 829.

In some embodiments, a first optical signal may be provided to the third grating coupler 536c. The first optical signal may be received by the fifth adiabatic coupler 218e from the third grating coupler 536c. The fifth waveguide 541e may adiabatically couple the first optical signal out of the fifth adiabatic coupler 218e. Additionally, the first waveguide 541a may provide the first optical signal to the third curved waveguide 538c. The third curved waveguide 538c may provide the first optical signal to the sixth waveguide 541f. The sixth waveguide 541f may adiabatically the first optical signal into the sixth adiabatic coupler 218f. The fourth grating coupler 536d may receive the first optical signal from the sixth adiabatic coupler 218f and the fourth grating coupler 536d may provide the first optical signal to an optical receiver. Additionally or alternatively, the first optical signal may propagate the various optical components in the reverse direction.

In some embodiments, a second optical signal may be provided to the second grating coupler 536b. The second optical signal may be received by the fourth adiabatic coupler 218d from the second grating coupler 536b. The fourth waveguide 541d may adiabatically couple the second optical signal out of the fourth adiabatic coupler 218d. Additionally, the fourth waveguide 541d may provide the second optical signal to the second curved waveguide 538b. The second curved waveguide 538b may provide the second optical signal to the third waveguide 541c. The third waveguide 541c may adiabatically couple the second optical signal into the third adiabatic coupler 218c. The third adiabatic coupler 218c may provide the second optical signal to the receive port 644. The second optical signal may propagate through an optical circuit (e.g., an OIC or a PIC) optically coupled to the receive port 644 and the transmit port 642.

The transmit port 642 may provide the second optical signal to the first adiabatic coupler 218a. The first waveguide 541a may adiabatically couple the second optical signal out of the first adiabatic coupler 218a. The first waveguide 541a may provide the second optical signal to the first curved waveguide 538a. The first curved waveguide 538a may provide the second optical signal to the second waveguide 541b. The second waveguide 541b may adiabatically couple the second optical signal into the second adiabatic coupler 218b. The first grating coupler 536a may receive the second optical signal from the second adiabatic coupler 218b and the first grating coupler 536a may provide the first optical signal to an optical receiver.

In some embodiments, including the adiabatic couplers 218a-f as not back-to-back adiabatic couplers and the curved waveguides 536a-c as illustrated in FIG. 8 may make an area of the cavity 109 reduce compared to embodiments, that include back-to-back adiabatic couplers. For example, a length of the cavity 109 (measured left-to-right or right-to-left in FIG. 8) may be substantially three mm instead of substantially six mm in other embodiments the include back-to-back adiabatic couplers (e.g., roughly half the length of the cavity 109 in the back to back embodiment described above).

In some embodiments, the curved waveguides 536a-c may include a small radius for high-contrast waveguides. For example, the radius may be equal to or less than 250 μm and the contrast of the waveguide refractive index may be equal to or less than 0.2.

Figure 9:
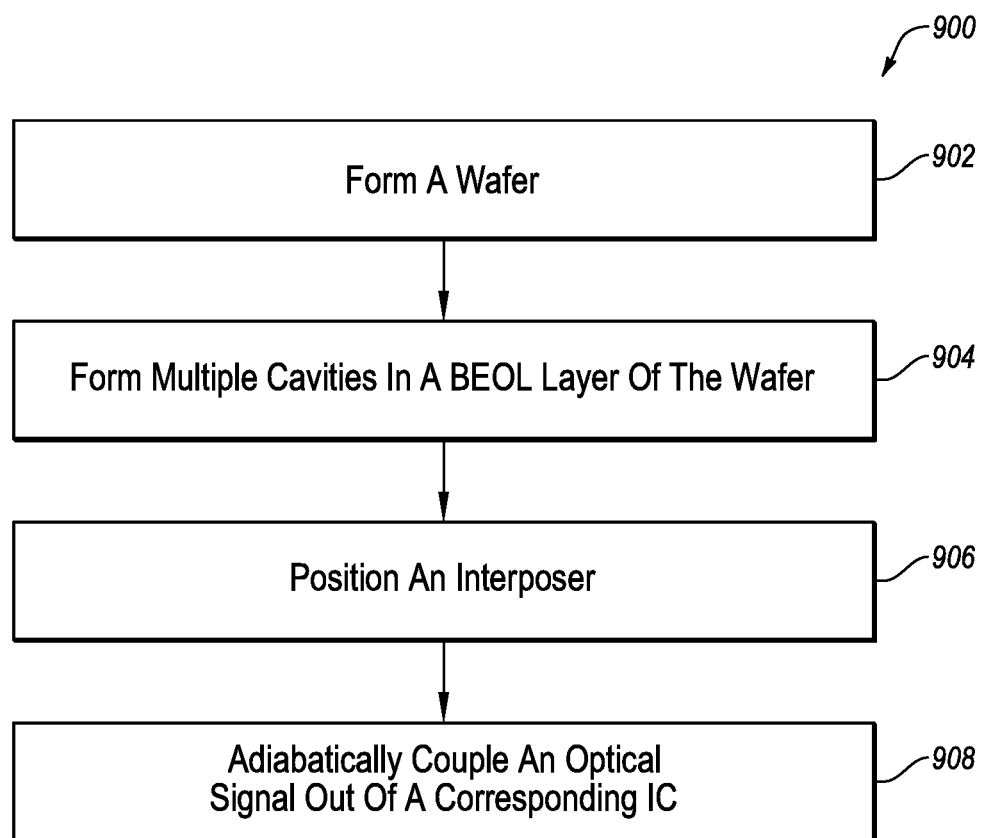
FIG. 9 illustrates a flowchart of a method to perform wafer level testing of integrated circuits in the wafer of FIG. 1A.

FIG. 9 illustrates a flowchart of a method 900 to perform wafer level testing of the ICs in the wafer 102 of FIG. 1A, according to at least one embodiment described in the present disclosure. The method 900 may be performed, in whole or in part, by an interposer and a testing fixture, such as the interposer 104, 205, 307, 413, 517, 619, 725, and 829 and testing fixture 206 of FIGS. 1A and 2-8. Although illustrated with discrete blocks, the steps and operations associated with one or more of the blocks of the method 900 may be divided into additional blocks, combined into fewer blocks, or eliminated, depending on the particular implementation.

The method 900 may include a block 902, at which the wafer may be formed. In some embodiments, the wafer may include the ICs. In some embodiments, each IC may include one or more adiabatic couplers. At block 904, multiple cavities may be formed in the BEOL layer of the wafer. Each cavity may be formed proximate a different IC in the wafer. In some embodiments, each cavity may be formed proximate one or more adiabatic coupler in a different IC in the wafer. For example, the cavity 109 of FIGS. 2-8 may be formed proximate the adiabatic coupler 218 in the wafer 102.

At block 906, the interposer may be positioned. The interposer may be positioned within a cavity proximate a corresponding IC. For example, the testing fixture 206 of FIG. 1A may position the interposer 104 within a first cavity 109a formed in the wafer 102.

At block 908, an optical signal may be adiabatically coupled out of the corresponding IC. In some embodiments, the optical signal may be adiabatically coupled out of the corresponding IC into a waveguide of the interposer. For example, the optical signal 216a may be adiabatically coupled out of the adiabatic coupler 218 into the waveguide 212 of FIG. 2, the waveguide 311 of FIG. 3, or the waveguide 426 of FIG. 4.

In some embodiments, the method 900 may include additional operations. For example, in some embodiments, the method 900 may also include measuring the optical signal adiabatically coupled into the waveguide. In addition, in some embodiments, the method 900 may include determining whether the corresponding IC is operating properly. In these and other embodiments, the corresponding IC may be determined to be operating properly or not based on the optical signal. For example, a signal strength of the optical signal adiabatically coupled into the waveguide may be measured to determine whether optical loss is occurring within the adiabatic couplers and/or other optical components located in the ICs. Additionally or alternatively, the signal strength of the optical signal adiabatically coupled into the waveguide may be measured to determine whether the optical signal is being degraded too much by the adiabatic couplers and/or other optical components located in the ICs and/or to determine an amount of optical loss through the adiabatic couplers and/or other optical components.

Modifications, additions, or omissions may be made to the method 900 without departing from the scope of the present disclosure. For example, the operations of method 900 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

With respect to the use of substantially any plural and/or singular terms in the present disclosure, those having skill in the art can translate from the plural to the singular and/or from the singular to the plural as is appropriate to the context and/or application. The various singular/plural permutations may be expressly set forth in the present disclosure for sake of clarity.

It will be understood by those within the art that, in general, terms used in the present disclosure, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed in the present disclosure also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described in the present disclosure for purposes of illustration, and that various modifications may be made without departing from the scope and spirit of the present disclosure. Accordingly, the various embodiments disclosed in the present disclosure are not intended to be limiting, with the true scope and spirit being indicated by the following claims. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
a wafer comprising a plurality of integrated circuits (ICs) and the wafer defining a plurality of cavities, each cavity of the plurality of cavities being formed in a back end of line (BEOL) layer of the wafer proximate a different IC of the plurality of ICs; and
an interposer configured to test the plurality of ICs and the interposer being configured to be placed in one cavity of the plurality of cavities at a time proximate a corresponding IC of the plurality of ICs, the interposer comprising:
a transparent layer configured to permit optical signals to pass through;
at least one waveguide located proximate the transparent layer, the at least one waveguide configured to adiabatically couple at least one optical signal out the plurality of ICs; and
a redirecting element optically coupled to the at least one waveguide and located proximate the transparent layer, the redirecting element configured to receive the at least one optical signal from the at least one waveguide and to vertically redirect the at least one optical signal towards the transparent layer.

2. The system of claim 1, the system further comprising an optical component located proximate the transparent layer and vertically above the redirecting element, the optical component configured to receive the at least one redirected optical signal.

3. The system of claim 2, wherein the optical component is configured to provide an electrical signal to an external device, the electrical signal representative of the at least one redirected optical signal.

4. The system of claim 2, wherein the optical component comprises at least one of a photo-detector, a photodiode, and an optical fiber.

5. The system of claim 1, wherein:
the at least one optical signal comprises a first optical signal and the at least one waveguide comprises a first waveguide and a second waveguide, the first waveguide is configured to adiabatically couple the first optical signal out of a corresponding IC of the plurality of ICs; and
the system further comprises a testing fixture located proximate the transparent layer, the testing fixture configured to provide a second optical signal, the second waveguide configured to receive the second optical signal and to adiabatically couple the second optical signal into the corresponding IC of the plurality of ICs.

6. The system of claim 1, wherein each IC of the plurality of ICs comprises one or more adiabatic couplers and the at least one waveguide is configured to adiabatically couple the at least one optical signal out of at least one adiabatic coupler of the one or more adiabatic couplers in a corresponding IC of the plurality of ICs.

7. The system of claim 6, wherein the plurality of cavities are formed in the wafer such that a portion of a front end of line (FEOL) layer of the wafer is located above the one or more adiabatic couplers in each IC of the plurality of ICs and the portion of the FEOL layer is thin enough to enable optical coupling between the one or more adiabatic couplers in each IC of the plurality of ICs and the at least one waveguide in the interposer.

8. The system of claim 1, wherein:
the redirecting element comprises a grating coupler configured to redirect the at least one optical signal; and
the interposer further comprises a mirror located below the grating coupler, wherein the mirror is configured to reduce degradation of the at least one redirected optical signal.

9. The system of claim 1, wherein the redirecting element comprises a mirror configured to vertically redirect the at least one optical signal towards the transparent layer.

10. The system of claim 1, the system further comprising a removable material configured to assist in optically coupling the at least one waveguide with the plurality of ICs.

11. The system of claim 1, wherein the at least one optical signal comprises a first optical signal and the at least one waveguide comprises:
a first waveguide configured to adiabatically couple the first optical signal out of a corresponding IC of the plurality of ICs; and
a second waveguide optically coupled to the first waveguide and the redirecting element, the second waveguide located proximate the first waveguide with a portion of the transparent layer positioned between the first waveguide and the second waveguide, the second waveguide being configured to adiabatically couple the first optical signal out of the first waveguide and to provide the first optical signal to the redirecting element.

12. The system of claim 11, the interposer further comprising:
a thick substrate configured to permit optical signals to pass through; and
an anti-reflection (AR) coating located on a top surface of the transparent layer between the thick substrate and the transparent layer.

13. The system of claim 12, wherein the redirecting element comprises a grating coupler optically coupled to the second waveguide and located within the transparent layer, the grating coupler configured to receive the at least one optical signal from the second waveguide and to vertically redirect the at least one optical signal towards the thick substrate.

14. The system of claim 1, wherein each IC of the plurality of ICs comprise at least one of a photonic integrated circuit and an optical integrated circuit.

15. A system comprising:
a wafer having a plurality of adiabatic couplers, the adiabatic couplers being configured to communicate optical signals for integrated circuits, the wafer having a back end of line (BEOL) layer and defining a plurality of cavities formed in the BEOL layer, each of the cavities being proximate at least one of the adiabatic couplers; and
a testing fixture being configured to test each of the integrated circuits and having an interposer, the interposer being configured to position in each of the cavities one at a time proximate the at least one adiabatic coupler, the interposer comprising:
a transparent layer configured to permit the optical signals to pass through;

at least one waveguide located proximate the transparent layer and being configured to adiabatically couple the optical signals with the at least one adiabatic coupler; and a directing element optically coupled to the at least one waveguide and located proximate the transparent layer, the directing element being configured to direct the optical signals between a horizontal direction towards the at least one waveguide and a vertical direction towards the transparent layer.

16. The system of claim 15, wherein the testing fixture comprises an optical component located proximate the transparent layer and located vertically above the directing element, the optical component configured to measure the optical signals directed thereto.

17. The system of claim 15, wherein the at least one waveguide comprises first and second waveguides; and wherein the at least one adiabatic coupler in a corresponding one of the cavities comprises first and second adiabatic couplers, the first waveguide being configured to adiabatically couple a first of the optical signals out of the first adiabatic coupler, the second waveguide being configured to adiabatically couple a second of the optical signals into the second adiabatic coupler.

18. The system of claim 15, wherein the directing element comprises:

a grating coupler optically coupled to the at least one waveguide and being configured to direct the optical signals, and a mirror located below the grating coupler and being configured to reduce degradation of the optical signals directed by the grating coupler; or a mirror being vertically arranged between the at least one waveguide and the transparent layer and being configured to direct the optical signals.

19. The system of claim 15, wherein the at least one waveguide comprises:

a first waveguide configured to adiabatically couple the optical signals with the at least one adiabatic coupler; and a second waveguide located proximate the first waveguide with a portion of the transparent layer positioned between the first waveguide and the second waveguide, the second waveguide being configured to adiabatically couple the optical signals with the first waveguide, the second waveguide being optically coupled the directing element.

20. The system of claim 15, further comprising a removable material disposed on a surface of the cavities, the removable material configured to assist optical coupling between the at least one adiabatic coupler and the at least one waveguide.

* * * * *